US012734774B2

(12) United States Patent
Kobayashi et al.

(10) Patent No.: US 12,734,774 B2
(45) Date of Patent: Sep. 15, 2026

(54) OPTICAL LAMINATE, ARTICLE, AND PRODUCTION METHOD FOR OPTICAL LAMINATE

(71) Applicant: DEXERIALS CORPORATION, Tochigi (JP)

(72) Inventors: Tomoaki Kobayashi, Shimotsuke (JP); Zhen Huang, Shimotsuke (JP); Katsutoshi Suzuki, Shimotsuke (JP); Tsuguto Suzuki, Shimotsuke (JP); Yuko Kibushi, Shimotsuke (JP)

(73) Assignee: DEXERIALS CORPORATION, Tochigi (JP)

(*) Notice: Subject to any disclaimer, the term of this patent is extended or adjusted under 35 U.S.C. 154(b) by 467 days.

(21) Appl. No.: 18/044,297

(22) PCT Filed: Sep. 8, 2021

(86) PCT No.: PCT/JP2021/032978
§ 371 (c)(1),
(2) Date: Mar. 7, 2023

(87) PCT Pub. No.: WO2022/054827
PCT Pub. Date: Mar. 17, 2022

(65) Prior Publication Data

US 2023/0324584 A1 Oct. 12, 2023

(30) Foreign Application Priority Data

Sep. 10, 2020 (JP) ................................ 2020-151806

(51) Int. Cl.
*B29D 11/00* (2006.01)
*C09D 5/16* (2006.01)
(Continued)

(52) U.S. Cl.
CPC .... *B29D 11/0073* (2013.01); *B29D 11/00865* (2013.01); *C09D 5/1681* (2013.01);
(Continued)

(58) Field of Classification Search
CPC .......... B29D 11/0073; B29D 11/00865; C09D 5/1681; C09D 5/1693; C23C 14/083;
(Continued)

(56) References Cited

U.S. PATENT DOCUMENTS 6,251,523 B1 6/2001 Takahashi et al.
8,945,684 B2 2/2015 Fournand
(Continued)

FOREIGN PATENT DOCUMENTS

CN 102725335 10/2012
CN 105779943 7/2016
(Continued)

OTHER PUBLICATIONS

English Translation of the Written Opinion of the Internatioanl Searching Authority (Year: 2021).*
(Continued)

*Primary Examiner* — Nathan L Van Sell
(74) *Attorney, Agent, or Firm* — Schwegman Lundberg & Woessner, P.A.

(57) ABSTRACT

This optical laminate 101 is an optical laminate including a plastic film 11, an adhesion layer 13, an optical function layer 14 and an antifouling layer 15 laminated in order, in which the antifouling layer 15 is made of a vapor-deposited film obtained by vapor deposition of an antifouling material, a film thickness of the antifouling layer 15 is 2.5 nm or more, a water vapor transmission rate is 1.5 g/($m^2$·1 day) or less, and a hue change ΔE value of reflected color in consideration of specular light (SCI) after contacting a sodium hydroxide aqueous solution having a liquid temperature of
(Continued)

55° C. and a concentration of 0.1 mol/L for four hours is less than 10.

19 Claims, 3 Drawing Sheets

(51) Int. Cl.
*C23C 14/08* (2006.01)
*C23C 14/10* (2006.01)
*C23C 14/12* (2006.01)
*C23C 14/24* (2006.01)
*C23C 14/34* (2006.01)
*G02B 1/113* (2015.01)
*G02B 1/14* (2015.01)
*G02B 1/18* (2015.01)

(52) U.S. Cl.
CPC .......... *C09D 5/1693* (2013.01); *C23C 14/083* (2013.01); *C23C 14/10* (2013.01); *C23C 14/12* (2013.01); *C23C 14/24* (2013.01); *C23C 14/34* (2013.01); *G02B 1/113* (2013.01); *G02B 1/14* (2015.01); *G02B 1/18* (2015.01)

(58) Field of Classification Search
CPC ......... C23C 14/10; C23C 14/12; C23C 14/24; C23C 14/34; C23C 14/0036; C23C 14/022; C23C 14/26; C23C 14/568; C23C 14/58; C23C 14/06; C23C 14/08; C23C 14/22; G02B 1/113; G02B 1/14; G02B 1/18; G02B 1/11; B32B 3/30; B32B 7/023
See application file for complete search history.

(56) References Cited

U.S. PATENT DOCUMENTS

2007/0146887 A1* 6/2007 Ikeda ...................... G02B 1/111 359/586
2009/0191391 A1 7/2009 Naito et al.
2009/0297812 A1 12/2009 Cangemi et al.
2010/0103523 A1 4/2010 Fukui et al.
2011/0117345 A1 5/2011 Nishimoto et al.
2012/0028005 A1 2/2012 Zheng et al.
2017/0139230 A1 5/2017 Ambler et al.
2018/0148609 A1 5/2018 Ono
2019/0310394 A1 10/2019 Miyamoto et al.
2020/0239360 A1 7/2020 Minowa et al.

FOREIGN PATENT DOCUMENTS

CN 105835465 A 8/2016
CN 208110086 11/2018
CN 109074906 12/2018
CN 109782379 5/2019
CN 110537116 12/2019
CN 110997587 4/2020
CN 112513682 3/2021
EP 933377 A2 * 8/1999 ............ C07F 7/1804
EP 3223043 A1 9/2017
JP 07104103 A 4/1995
JP 10133001 5/1998
JP H10306166 11/1998
JP 11258405 9/1999
JP 2000144097 A 5/2000
JP 2000308846 A 11/2000
JP 2002243906 8/2002
JP 2002292776 10/2002
JP 2003062920 3/2003
JP 2004021550 1/2004
JP 2004138662 5/2004
JP 2004170500 A 6/2004
JP 2004170962 A 6/2004
JP 2004258469 9/2004
JP 2005301208 A 10/2005
JP 2006175438 A 7/2006
JP 2006220733 8/2006
JP 2006527402 11/2006
JP 2007194109 8/2007
JP 2008062460 A 3/2008
JP 2008284408 11/2008
JP 2009109850 A 5/2009
JP 2010191144 A 9/2010
JP 2011013654 A 1/2011
JP 5245893 7/2013
JP 2014005353 1/2014
JP 2015007290 1/2015
JP 2016128927 7/2016
JP 2016224443 A 12/2016
JP 2017161893 9/2017
JP 2017227898 A 12/2017
JP 2018004921 1/2018
JP 2018008431 1/2018
JP 2018527615 A 9/2018
JP 2019035969 3/2019
JP 6542970 B2 6/2019
JP 2019086605 A 6/2019
JP 2019196488 A 11/2019
JP 2020037248 3/2020
JP 2020519557 A 7/2020
JP 2020148787 9/2020
JP 2021177200 11/2021
JP 2022007992 A 1/2022
JP 2022130457 9/2022
KR 20110025146 3/2011
KR 101362967 2/2014
KR 20170076660 7/2017
TW 201504163 2/2015
TW 201711851 4/2017
WO WO-2014129333 A1 8/2014
WO WO-2015159839 A1 10/2015
WO WO-2017126300 A1 7/2017
WO WO-2018193742 A1 10/2018
WO WO-2018208760 A1 11/2018
WO 2019035398 2/2019
WO WO-2019064969 A1 4/2019
WO WO-2019078313 A1 4/2019
WO 2019107036 6/2019
WO WO-2020027037 A1 2/2020
WO WO-2021106797 A1 6/2021
WO WO-2021177348 A1 9/2021
WO WO-2021177350 A1 9/2021

OTHER PUBLICATIONS

"U.S. Appl. No. 17/905,392, Non Final Office Action mailed Jun. 13, 2024", 9 pgs.
"U.S. Appl. No. 18/044,295, Non Final Office Action mailed Jan. 14, 2025", 15 pgs.
"Korean Application No. 10-2022-7022923, Office Action dated Nov. 26, 2024", w English Translation, (Nov. 26, 2024), 8 pgs.
"U.S. Appl. No. 17/996,991, Non Final Office Action mailed May 6, 2025", 15 pgs.
"", Machine translation W02019064969A1, (2025).
"", Machine translation JP2000-308846, (2025).
"", Machine translation JP 2003-062920A, (2025).
"", Machine translation JP2004-138662A, (2025).
"", Machine translation W02020027037A1, (2025).
"", Machine translation JP 2008-062460A, (2025).
"Japanese Application No. 2022-148971, Office Action dated Feb. 25, 2025", w English Translation, (Feb. 25, 2025), 8 pgs.
"Japanese Application No. 2022-182614, Office Action dated Feb. 25, 2025", w English Translation, (Feb. 25, 2025), 11 pgs.
"Korean Application No. 10-2022-7022923, Office Action dated Mar. 23, 2024", w English Translation, (Mar. 23, 2024), 15 pgs.
"Korean Application No. 10-2022-7022924, Office Action dated Mar. 23, 2024", w English Translation, (Mar. 23, 2024), 13 pgs.
"U.S. Appl. No. 17/998,449, Non Final Office Action mailed Dec. 4, 2024", 20 pgs.

(56) References Cited

OTHER PUBLICATIONS

"European Application No. 21842215.2, Search Report dated Jun. 6, 2025", (Jun. 6, 2025), 10 pgs.
"European Application No. 21866787.1, Search Report dated Jun. 30, 2025", (Jun. 30, 2025), 6 pgs.
"European Application No. 21866786.3, Search Report dated Jun. 30, 2025", (Jun. 30, 2025), 11 pgs.
"European Application Serial No. 21765327.8, Search Report dated May 21, 2024", (May 21, 2024), 7 pgs.
"European Application Serial No. 21763530.9, Search Report dated May 21, 2024", (May 21, 2024), 8 pgs.
"Chinese Application No. 202180017403.5, Office Action dated May 27, 2024", w English Translation, (May 27, 2024), 16 pgs.
"Chinese Application No. 202180017459.0, Office Action dated May 27, 2024", (May 27, 2024), 16 pgs.
"Taiwanese Application No. 110107659, Office Action dated Jun. 25, 2024", w English Translation, (Jun. 25, 2024), 11 pgs.
"Korean Application Serial No. 10-2022-7042786, Office Action dated Jan. 25, 2024", w English Translation, (Jan. 25, 2024), 15 pgs.
"Taiwanese Application No. 110133458, Office Action dated Jan. 3, 2025", w English Translation, (Jan. 3, 2025), 15 pgs.
"U.S. Appl. No. 17/905,326, Final Office Action mailed Dec. 20, 2024", 11 pgs.
"U.S. Appl. No. 17/905,326, Non Final Office Action mailed Jul. 24, 2024", 10 pgs.
"Chinese Application No. 202180017459.0, Office Action dated Sep. 29, 2024", w English Translation, (Sep. 29, 2024), 18 pgs.
"Japanese Application Serial No. 2023-040986, Notice of Allowance dated May 30, 2023", w English Translation, (May 30, 2023), 5 pgs.
"Indian Application No. 202217060898, Office Action dated May 28, 2025", (May 28, 2025), 2 pgs.
"International Application Serial No. PCT/JP2021/008165, International Search Report dated May 25, 2021", w/ English Translation, (May 25, 2021), 6 pgs.
"International Application Serial No. PCT/JP2021/008174, International Search Report dated May 25, 2021", w/ English Translation, (May 25, 2021), 6 pgs.
"International Application Serial No. PCT/JP2021/026740, International Search Report dated Aug. 31, 2021", w/ English Translation, (Aug. 31, 2021), 6 pgs.
"International Application Serial No. PCT/JP2021/026794, International Search Report dated Aug. 31, 2021", w/ English Translation, (Aug. 31, 2021), 9 pgs.
"International Application Serial No. PCT/JP2021/032978, International Search Report dated Nov. 22, 2021", w/ English Translation, (Nov. 22, 2021), 6 pgs.
"International Application Serial No. PCT/JP2021/032991, International Search Report dated Nov. 22, 2021", w/ English Translation, (Nov. 22, 2021), 6 pgs.
"Japanese Application Serial No. 2020-037146, Office Action dated May 19, 2020", w/ English Translation, (May 19, 2020), 8 pgs.
"Japanese Application Serial No. 2020-153209, Office Action dated Dec. 1, 2020", w/ English Translation, (Dec. 1, 2020), 8 pgs.
"Japanese Application Serial No. 2022-000546, Office Action dated Mar. 15, 2022", w/ English Translation, (Mar. 15, 2022), 7 pgs.
"Japanese Application Serial No. 2022-093913, Office Action dated Jul. 5, 2022", w/ English Translation, (Jul. 5, 2022), 6 pgs.
"Indian Application No. 202317014369, Office Action dated Sep. 17, 2025", w English Translation, (Sep. 17, 2025), 6 pgs.
"Chinese Application Serial No. 202180048162.0, Decision of Rejection mailed Jul. 26, 2025", w English Translation, 19 pgs.
"Chinese Application No. 202180048881.2, Office Action dated Jun. 28, 2025", (Jun. 28, 2025), 16 pgs.
"Chinese Application No. 202180054441.8, Office Action dated Jun. 29, 2025", (Jun. 29, 2025), 18 pgs.
Keisu, "Nanotechnology", 1st Edition, North Kyoto: Weapon Industry Publishing Co., Ltd., (Mar. 31, 2006), pp. 157.
King, "Polymer Modification Methods and Technologies", First Edition, Beijing: Chinese Spinning Publisher, (Jun. 30, 2020), pp. 86-87.
"Japanese Application No. 2022-182614, Decision for Dismissal of Amendment dated Oct. 28, 2025", w English Translation, Oct. 28, 2025, 6 pgs.

* cited by examiner

FIG. 4

OPTICAL LAMINATE, ARTICLE, AND PRODUCTION METHOD FOR OPTICAL LAMINATE

PRIORITY APPLICATIONS

This application is a U.S. National Stage Filing under 35 U.S.C. § 371 from International Application No. PCT/JP2021/032978, filed on Sep. 8, 2021, and published as WO2022/054827 on Mar. 17, 2022, which claims the benefit of priority to Japanese Application No. 2020-151806, filed on Sep. 10, 2020; the benefit of priority of each of which is hereby claimed herein, and which applications and publication are hereby incorporated herein by reference in their entireties.

TECHNICAL FIELD

The present invention relates to an optical laminate having an antifouling layer on a surface, an article including this optical laminate, and a production method for an optical laminate.

BACKGROUND ART

For example, in flat panel displays (FPDs), touch panels, solar cells and the like, as optical laminates, a variety of antireflection films are in use for antireflection of surfaces.

Conventionally, as antireflection films, antireflection films including a multi-layer film in which high-refractive index layers and low-refractive index layers are sequentially laminated on a transparent substrate have been proposed. On the outermost surfaces of such antireflection films, ordinarily, an antifouling layer (surface protective layer) is formed for the purpose of the protection and antifouling of the surfaces.

In recent years, antireflection films (optical laminates) have been in frequent use in touch panels of smartphones and a variety of operation equipment. This has created a demand for improvement in the wear resistance of optical laminates.

For example, Patent Document 1 discloses a transparent substrate laminate having wear resistance improved by setting the amount of fluorine that is contained in a configuration material of an antifouling layer within a specific range.

Patent Document 2 describes a formation method for an antifouling layer in which at least one surface of a base material to be treated is pre-treated before the formation of an antifouling layer and the antifouling layer is formed on this pretreated surface. In addition, Patent Document 2 describes that the pretreatment is any of a high-frequency discharge plasma method, an electron beam method, an ion beam method, a vapor deposition method, a sputtering method, an alkali treatment method, an acid treatment method, a corona treatment method and an atmospheric pressure glow discharge plasma method.

Patent Document 3 describes a production method for an antifouling optical article in which an antireflection film is formed on a surface of a substrate by vapor deposition, then, a plasma treatment is performed by introducing oxygen or argon and, after that, an antifouling layer is formed by vacuum vapor deposition of a fluorine-containing organic silicon compound.

CITATION LIST

Patent Document

[Patent Document 1]
PCT International Publication No. WO 2019/078313
[Patent Document 2]
Japanese Unexamined Patent Application, First Publication No. 2006-175438
[Patent Document 3]
Japanese Unexamined Patent Application, First Publication No. 2005-301208
[Patent Document 4]
Japanese Patent No. 6542970

SUMMARY OF INVENTION

Technical Problem

However, the transparent substrate laminate described in Patent Document 1 has a problem in that an unreacted substance that contributes to the wear resistance is scraped off due to repetitive friction, which makes it impossible to maintain high wear resistance. There has been a demand for an optical laminate including an antifouling layer capable of maintaining high wear resistance against repetitive friction.

The present invention has been made in consideration of the above-described problem, and an objective of the present invention is to provide an optical laminate including an antifouling layer having excellent durability, an article including this optical laminate, and a production method for an optical laminate.

Solution to Problem

In order to solve the above-described problem, this invention is proposing the following means.

(1) An optical laminate according to a first aspect of the present invention is an optical laminate including a plastic film, an adhesion layer, an optical function layer and an antifouling layer laminated in order, in which the antifouling layer is made of a vapor-deposited film obtained by vapor deposition of an antifouling material, a film thickness of the antifouling layer is 2.5 nm or more, a water vapor transmission rate is 1.5 $g/(m^2 \cdot 1$ day) or less, and a hue change $\Delta E$ value of reflected color in consideration of specular light (SCI) after contacting a sodium hydroxide aqueous solution having a liquid temperature of 55° C. and a concentration of 0.1 mol/L for four hours is less than 10.

(2) An optical laminate according to a second aspect of the present invention is an optical laminate including a plastic film, an adhesion layer, an optical function layer and an antifouling layer laminated in order, in which the antifouling layer is made of a vapor-deposited film obtained by vapor deposition of an antifouling material, a film thickness of the antifouling layer is 2.5 nm or more, a water vapor transmission rate is 1.5 $g/(m^2 \cdot 1$ day) or less, and a survival rate of fluorine measured using X-ray fluorescence analysis (XRF) after contacting a sodium hydroxide aqueous solution having a liquid temperature of 55° C. and a concentration of 0.1 mol/L for four hours is 85% or more.

(3) The optical laminate according to the above-described aspect, in which a change rate of surface roughness represented by the following formula (1) may be 5% to 35% or a change rate of an average length of elements represented by the following formula (2) may be 7% to 70%;

$$\text{change rate (\%) of surface roughness} = ((Ra2/Ra1) - 1) \times 100 (\%) \qquad \text{Formula (1)}$$

(in the formula (1), Ra1 indicates surface roughness (Ra) of the antifouling layer in the optical laminate in which the antifouling layer has been formed without performing a surface treatment, and Ra2 indicates surface roughness (Ra) of the antifouling layer in the optical laminate in which a surface has been treated and then the antifouling layer has been formed)

$$\text{change rate (\%) of average length of elements} = ((RSm2/RSm1)-1)\times 100(\%) \quad \text{Formula (2)}$$

(in the formula (2), RSm1 indicates the average length of elements (RSm) of the antifouling layer in the optical laminate in which the antifouling layer has been formed without performing a surface treatment, and RSm2 indicates the average length of elements (RSm) of the antifouling layer in the optical laminate in which the surface has been treated and then the antifouling layer has been formed)

where, Ra2 is 3 nm or more and 10 nm or less, and Rsm2 is 55 nm or more and 90 nm or less.

(4) The optical laminate according to the above-described aspect, in which haze may be 2% or less, and a contact angle difference with respect to water before and after an abrasion test where a waste cloth is reciprocated 4000 times may be 12° or less.

(5) The optical laminate according to the above-described aspect, in which haze may be 2% or less, and a contact angle difference with respect to water before friction and after the friction for which a steel wool is horizontally and reciprocally moved 500 times using a friction tester in which the steel wool based on JIS L 0849 is used may be 12° or less.

(6) The optical laminate according to the above-described aspect, in which haze may be 2% or less, and a change amount (ΔE value) of reflected color in consideration of specular light (SCI) before friction and after the friction for which a steel wool is horizontally and reciprocally moved 500 times may be 3.0 or less.

(7) The optical laminate according to the above-described aspect, in which a survival amount of a fluorine atom in the antifouling layer by XRF after irradiating with ultrasonic waves of 40 KHz and 240 W for 10 minutes and washing in a fluorine-based solvent may be 70% or more.

(8) The optical laminate according to the above-described aspect, in which haze may be more than 2%, and a contact angle difference with respect to water before and after an abrasion test where a waste cloth is reciprocated 4000 times may be 7° or less.

(9) The optical laminate according to the above-described aspect, in which an initial amount of fluorine measured using X-ray fluorescence analysis (XRF) may be 0.03 or more.

(10) The optical laminate according to the above-described aspect, in which the optical function layer may include any one selected from an antireflection layer and a selective reflection layer.

(11) The optical laminate according to the above-described aspect, in which the optical function layer may include a low-refractive index layer.

(12) The optical laminate according to the above-described aspect, in which the optical function layer may be made of a laminate in which a low-refractive index layer and a high-refractive index layer are alternately laminated.

(13) The optical laminate according to the above-described aspect, in which the antifouling layer may be provided in contact with the low-refractive index layer.

(14) The optical laminate according to the above-described aspect, in which the adhesion layer may contain a metal or an oxide of a metal.

(15) The optical laminate according to the above-described aspect, in which the adhesion layer and the optical function layer may be formed by sputtering.

(16) The optical laminate according to the above-described aspect, in which the antifouling material may contain a fluorine-based organic compound.

(17) The optical laminate according to the above-described aspect may further include a hardcoat layer between the transparent base material and the adhesion layer.

(18) An article according to a fourth aspect of the present invention may include the optical laminate according to the above-described aspect.

(19) A production method for an optical laminate according to a fifth aspect of the present invention is a production method for the optical laminate according to the above-described aspect, the method having a film formation step of an optical function layer alternately having a step of forming a low-refractive index layer at a degree of vacuum of less than 0.5 Pa and a step of forming a high-refractive index layer at a degree of vacuum of less than 1.0 Pa, a glow discharge treatment step of surface-treating a surface of the optical function layer by a glow discharge and an antifouling layer formation step of forming the antifouling layer made of a vapor-deposited film obtained by vapor deposition of an antifouling material by vacuum vapor deposition on one surface side of the optical function layer.

(20) The production method for an optical laminate according to the above-described aspect further having an optical function layer formation step of forming the optical function layer by sputtering, in which the optical function layer formation step and the antifouling layer formation step may be continuously performed under reduced pressure.

Advantageous Effects of Invention

According to the present invention, it becomes possible to provide an optical laminate including an antifouling layer having excellent durability, an article including this optical laminate, and a production method for an optical laminate.

BRIEF DESCRIPTION OF DRAWINGS

FIG. 4 is a schematic view for describing an example of a production device that can be used in a production method for an optical laminate of the present embodiment.

DESCRIPTION OF EMBODIMENTS

Figure 1:
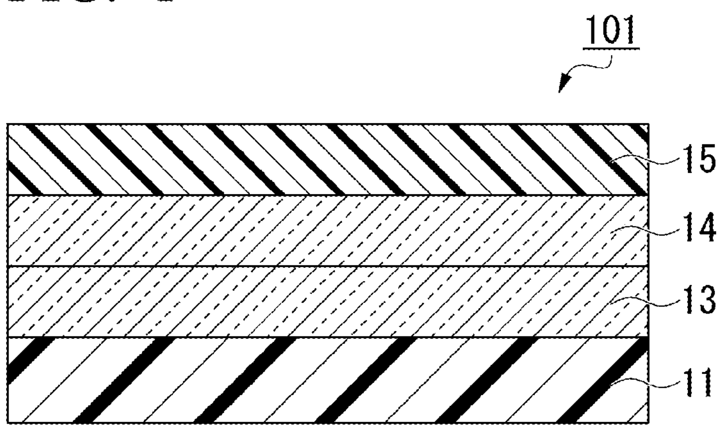
FIG. 1 is a cross-sectional view showing an example of an optical laminate of the present embodiment.

Hereinafter, the present embodiment will be described in detail with appropriate reference to drawings. In the drawings to be used in the following description, there will be cases where a characteristic portion is shown in an enlarged manner for convenience in order to facilitate the understanding of the characteristics of the present invention, and the dimensional ratio or the like of each configuration element is different from actual one in some cases. Materials, dimensions, and the like to be exemplified in the following description are simply examples, and the present invention is not limited thereto and can be carried out after being appropriately modified to an extent that the effect of the present invention is exhibited.

[Optical Laminate]

FIG. 1 is a cross-sectional view for describing an example of an optical laminate of the present embodiment.

As shown in FIG. 1, an optical laminate 101 of the present embodiment includes a transparent base material 11, an adhesion layer 13, an optical function layer 14 and an antifouling layer 15 laminated in order.

The adhesion layer 13 is a layer that develops adhesion.

The optical function layer 14 is a layer that develops an optical function. The optical function is a function of controlling reflection, transmission and refraction, which are the properties of light, and examples thereof include an antireflection function, a selective reflection function, a lens function and the like.

The optical function layer 14 preferably includes any one selected from an antireflection layer and a selective reflection layer. As the antireflection layer and the selective reflection layer, well-known layers can be used. The antireflection layer and the selective reflection layer may be both a single layer or a laminate of a plurality of layers.

Figure 2:
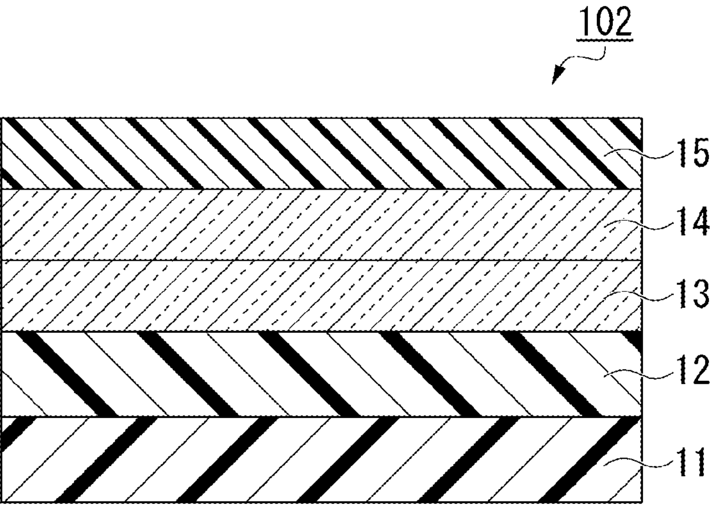
FIG. 2 is a cross-sectional view showing another example of the optical laminate of the present embodiment.

FIG. 2 is a cross-sectional view showing another example of the optical laminate of the present embodiment.

An optical laminate 102 shown in FIG. 2 includes the transparent base material 11, a hardcoat layer 12, the adhesion layer 13, the optical function layer 14 and the antifouling layer 15 laminated in order.

The adhesion layer 13 is a layer that develops adhesion.

The optical function layer 14 is a layer that develops an optical function. The optical function is a function of controlling reflection, transmission and refraction, which are the properties of light, and examples thereof include an antireflection function, a selective reflection function, a lens function and the like.

The optical function layer 14 preferably includes any one selected from an antireflection layer and a selective reflection layer. As the antireflection layer and the selective reflection layer, well-known layers can be used. The antireflection layer and the selective reflection layer may be both a single layer or a laminate of a plurality of layers.

Figure 3:
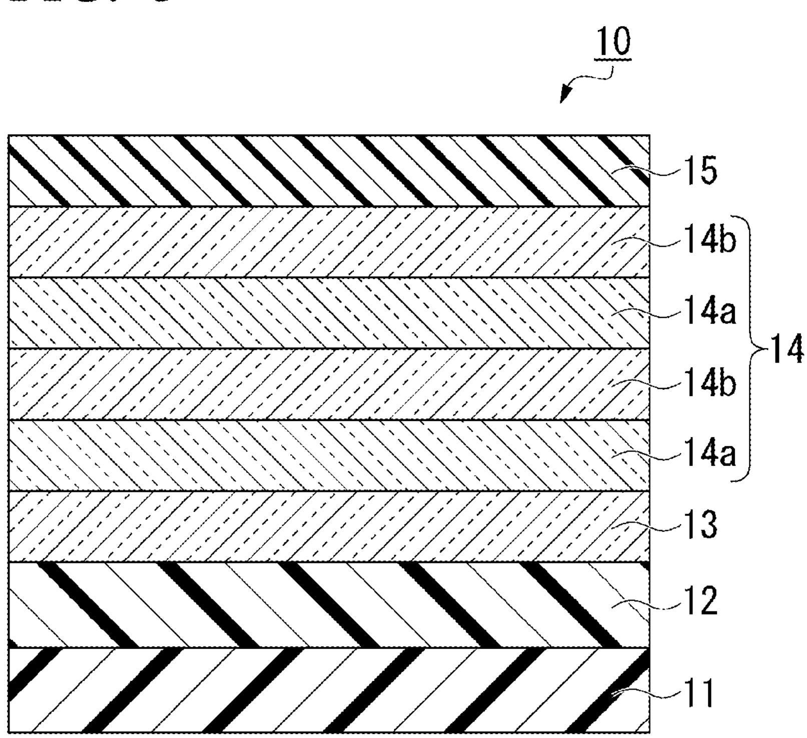
FIG. 3 is a cross-sectional view showing still another example of the optical laminate of the present embodiment.

FIG. 3 is a cross-sectional view showing still another example of the optical laminate of the present embodiment.

An optical laminate 10 shown in FIG. 3 is the optical laminate 102 shown in FIG. 2 in which an antireflection layer is provided as the optical function layer 14. The optical function layer 14 (antireflection layer) is made of a laminate in which low-refractive index layers **14*b* and high-refractive index layers 14*a* are alternately laminated as shown in FIG. 3. In the optical function layer 14 shown in FIG. 3, the hardcoat layer 12, the adhesion layer 13, the high-refractive index layer 14*a*, the low-refractive index layer 14*b*, the high-refractive index layer 14*a*, the low-refractive index layer 14*b* and the antifouling layer 15 are laminated in this order from the transparent base material 11 side. Therefore, the antifouling layer 15 is in contact with the low-refractive index layer 14*b* in the optical function layer 14**.

The transparent base material 11 needs to be formed of a transparent material capable of transmitting light in the visible light range. For example, as the transparent base material 11, a plastic film is preferably used. Specific examples of a configuration material of the plastic film include polyester-based resins, acetate-based resins, polyethersulfone-based resins, polycarbonate-based resins, polyamide-based resins, polyimide-based resins, polyolefin-based resins, (meth)acrylic resins, polyvinyl chloride-based resins, polyvinylidene chloride-based resins, polystyrene-based resins, polyvinyl alcohol-based resins, polyarylate-based resins and polyphenylene sulfide-based resins.

"Transparent material" mentioned in the present invention refers to a material having a transmittance of 80% or more with respect to light in a wavelength range where the material is used as long as the effect of the present invention is not impaired.

In addition, in the present embodiment, "(meth)acryl" means acryl and methacryl.

As long as the optical characteristics are not significantly impaired, the transparent base material 11 may contain a reinforcing material. The reinforcing material is, for example, a cellulose nanofiber, nano silica or the like. Particularly, polyester-based resins, acetate-based resins, polycarbonate-based resins and polyolefin-based resins are preferably used as the reinforcing material. Specifically, a triacetyl cellulose (TAC) base material is preferably used as the reinforcing material.

In addition, as the transparent base material 11, a glass film, which is an inorganic base material, can also be used.

If the plastic film is a TAC base material, when the hardcoat layer 12 has been formed on one surface side of the TAC base material, a permeation layer is formed by the permeation of some of the configuration components of the hardcoat layer 12. As a result, the adhesion between the transparent base material 11 and the hardcoat layer 12 becomes favorable, and the generation of an interference fringe attributed to a refractive index difference between the layers can be suppressed.

The transparent base material 11 may be a film imparted with an optical function and/or a physical function. Examples of the film having an optical function and/or a physical function include a polarizing plate, a phase difference compensation film, a heat ray-shielding film, a transparent conductive film, a brightness enhancement film, a barrier property enhancement film and the like.

The thickness of the transparent base material 11 is not particularly limited, but is preferably, for example, 25 μm or more. The film thickness of the transparent base material 11 is more preferably 40 μm or more.

If the thickness of the transparent base material 11 is 25 μm or more, the stiffness of the base material itself is secured, which makes it unlikely for wrinkles to be generated even when stress is applied to the optical laminate 10. In addition, if the thickness of the transparent base material 11 is 25 μm or more, even when the hardcoat layer 12 is continuously formed on the transparent base material 11, wrinkles are unlikely to be generated, and production-related concerns are small, which are preferable. When the thickness of the transparent base material 11 is 40 μm or more, wrinkles are more unlikely to be generated, which is preferable.

In a case where production is performed with a roll, the thickness of the transparent base material 11 is preferably 1000 μm or less and more preferably 600 μm or less. When the thickness of the transparent base material 11 is 1000 μm or less, it is easy to wind the optical laminate 10 in the middle of production and the optical laminate after production in a roll shape, and it is possible to efficiently produce the optical laminate 10. In addition, when thickness of the transparent base material 11 is 1000 μm or less, the thickness reduction and weight reduction of the optical laminate 10 become possible. When the thickness of the transparent base material 11 is 600 μm or less, it is possible to more efficiently produce the optical laminate 10, and additional thickness reduction and weight reduction become possible, which is preferable.

The surface of the transparent base material 11 may be subjected to an etching treatment such as sputtering, a corona discharge, ultraviolet irradiation, electron beam irradiation, chemical conversion or oxidation and/or a primer treatment in advance. These treatments performed in advance make it possible to improve the adhesion to the hardcoat layer 12 that is to be formed on the transparent base material 11. In addition, before the formation of the hardcoat layer 12 on the transparent base material 11, it is also preferable to perform dust removal and cleaning on the surface of the transparent base material 11 by performing solvent washing, ultrasonic washing or the like on the surface of the transparent base material 11 as necessary.

As the hardcoat layer 12, well-known layers can be used. The hardcoat layer 12 may be formed of a binder resin alone or may contain a filler to an extent that the transparency is not impaired together with a binder resin. As the filler, a filler made of an organic substance may be used, a filler made of an inorganic substance may be used, or a filler made up of an organic substance and an inorganic substance may be used.

As the binder resin that is used in the hardcoat layer 12, a transparent binder resin is preferable, and it is possible to use, for example, ionizing radiation curable resins, thermoplastic resins, thermosetting resins and the like, which are resins that cure by ultraviolet rays or electron beams.

Examples of the ionizing radiation curable resins that are used as the binder resin in the hardcoat layer 12 include ethyl (meth)acrylate, ethylhexyl (meth)acrylate, styrene, methylstyrene, N-vinylpyrrolidone and the like.

In addition, examples of compounds that are ionizing radiation curable resins having two or more unsaturated bonds include polyfunctional compounds such as trimethylolpropane tri(meth)acrylate, tripropylene glycol di(meth) acrylate, diethylene glycol di(meth)acrylate, dipropylene glycol di(meth)acrylate, pentaerythritol tri(meth)acrylate, pentaerythritol tetra(meth)acrylate, dipentaerythritol hexa (meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyester di(meth)acrylate, bisphenol di(meth)acrylate, diglycerin tetra(meth)acrylate, adamantyl di(meth)acrylate, isobornyl di(meth)acrylate, dicyclopentane di(meth)acrylate, tricyclodecane di(meth) acrylate and ditrimethylolpropane tetra(meth)acrylate and the like. Among these, pentaerythritol triacrylate (PETA), dipentaerythritol hexaacrylate (DPHA) and pentaerythritol tetraacrylate (PETTA) are preferably used. "(Meth)acrylate" refers to methacrylate and acrylate. In addition, as the ionizing radiation curable resins, it is possible to use the above-described compounds after being modified with propylene oxide (PO), ethylene oxide (EO), caprolactone (CL) or the like.

Examples of the thermoplastic resins that are used as the binder resin in the hardcoat layer 12 include styrene-based resins, (meth)acrylic resins, vinyl acetate-based resins, vinyl ether-based resins, halogen-containing resins, alicyclic olefin-based resins, polycarbonate-based resins, polyester-based resins, polyamide-based resins, cellulose derivatives, silicone-based resins, rubber or elastomers and the like. The thermoplastic resins are preferably amorphous and soluble in organic solvents (particularly, common solvents capable of dissolving a plurality of polymers and curable compounds). In particular, styrene-based resins, (meth)acrylic resins, alicyclic olefin-based resins, polyester-based resins, cellulose derivatives (cellulose esters and the like) and the like are preferable from the viewpoint of transparency and weather resistance.

Examples of the thermosetting resins that are used as the binder resin in the hardcoat layer 12 include phenolic resins, urea resins, diallyl phthalate resins, melamine resins, guanamine resins, unsaturated polyester resins, polyurethane resins, epoxy resins, amino alkyd resins, melamine-urea cocondensation resins, silicon resins, polysiloxane resins (including so-called silsesquioxanes having a basket shape, a ladder shape or the like and the like) and the like.

The hardcoat layer 12 may contain an organic resin and an inorganic material and may be an organic/inorganic hybrid material. As an example, a material formed by a sol-gel method is exemplified. Examples of the inorganic material include silica, alumina, zirconia and titania. As the organic material, for example, acrylic resins are exemplary examples.

As the filler that is contained in the hardcoat layer 12, a variety of fillers can be selected depending on the use of the optical laminate 10 from the viewpoint of the antiglare property, the adhesion to the optical function layer 14 to be described below and the anti-blocking property. Specifically, for example, well-known fillers such as silica (Si oxide) particles, alumina (aluminum oxide) particles and fine organic particles can be used.

The hardcoat layer 12 may contain, for example, the binder resin and silica particles and/or alumina particles as the filler. When silica particles and/or alumina particles are dispersed as the filler in the hardcoat layer 12, fine unevenness can be formed on the surface of the hardcoat layer 12. These silica particles and/or alumina particles may be exposed on the surface of the hardcoat layer 12 on the optical function layer 14 side. In this case, the binder resin in the hardcoat layer 12 and the optical function layer 14 are strongly joined together. Therefore, the adhesion between the hardcoat layer 12 and the optical function layer 14 improves, the hardness of the hardcoat layer 12 becomes high, and the scratch resistance of the optical laminate 10 becomes favorable.

The average particle diameter of the filler in the hardcoat layer 12 is, for example, 800 nm or less, preferably 780 nm or less and more preferably 100 nm or less. As the filler having such a size, for example, silica particles, alumina particles and the like are preferably used. When the particle diameter of the filler is set within the above-described range, the haze value of the entire optical laminate 10 becomes 2% or less. The optical laminate 10 having haze of 2% or less has high transparency and becomes a so-called clear type antireflection film.

The average particle diameter of the filler in the hardcoat layer 12 may be, for example, 0.5 μm or more. As the filler having such a size, for example, the fine organic particles of an acrylic resin or the like are preferably used. When the particle diameter of the filler is set within the above-described range, the haze value of the entire optical laminate 10 becomes more than 2%. The optical laminate 10 having haze of more than 2% has an antiglare property and becomes a so-called antiglare (AG) type antireflection film. Even in this case, the average particle diameter of the filler is preferably 10 μm or less, more preferably 5 μm or less, and particularly preferably 3 μm or less.

As the filler that is contained in the hardcoat layer 12, a variety of reinforcing materials can be used as long as the optical characteristics are not impaired in order to impart strong toughness to the hardcoat layer 12. As the reinforcing materials, for example, a cellulose nanofiber is an exemplary example.

The thickness of the hardcoat layer 12 is not particularly limited, but is, for example, preferably 0.5 μm or more and more preferably 1 μm or more. The thickness of the hardcoat layer 12 is preferably 100 μm or less. When the thickness of the hardcoat layer 12 is 0.5 μm or more, surface hardness can be obtained, which makes it unlikely for scratches to be generated during production. In addition, when thickness of the hardcoat layer 12 is 100 μm or less, the thickness reduction and weight reduction of the optical laminate 10 become possible. In addition, when thickness of the hardcoat layer 12 is 100 μm or less, micro-cracks in the hardcoat layer 12, which are generated when the optical laminate 10 has bent in the middle of production, are unlikely to be generated, and the productivity becomes favorable.

The hardcoat layer 12 may be a single layer or a layer in which a plurality of layers is laminated. In addition, the hardcoat layer 12 may be further imparted with a well-known function, for example, ultraviolet absorption performance, antistatic performance, a refractive index adjustment function or a hardness adjustment function.

In addition, the function that is imparted to the hardcoat layer 12 may be imparted to a single hardcoat layer or may be divided and imparted to a plurality of layers.

The adhesion layer 13 is a layer that is formed to make the adhesion between the transparent base material 11 or the hardcoat layer 12, which is an organic film, and the optical function layer 14, which is an inorganic film, favorable. In the optical laminate shown in FIG. 3, the adhesion layer 13 is provided between the hardcoat layer 12 and the optical function layer 14. The adhesion layer 13 has a function of causing the hardcoat layer 12 and the optical function layer 14 to adhere together. The adhesion layer 13 is preferably made of a metal oxide or metal in an oxygen-deficient state. The metal oxide in an oxygen-deficient state refers to a metal oxide in a state where the number of oxygen atoms lacks compared with that in the stoichiometric composition. Examples of the metal oxide in an oxygen-deficient state include SiOx, AlOx, TiOx, ZrOx, CeOx, MgOx, ZnOx, TaOx, SbOx, SnOx, MnOx and the like. In addition, examples of the metal include Si, Al, Ti, Zr, Ce, Mg, Zn, Ta, Sb, Sn, Mn, In and the like. The adhesion layer 13 may be, for example, SiOx where x is more than 0 and less than 2.0. In addition, the adhesion layer may be formed of a mixture of a plurality of kinds of metals or metal oxides.

The thickness of the adhesion layer is preferably more than 0 nm and 20 nm or less and particularly preferably 1 nm or more and 10 nm or less from the viewpoint of maintaining the transparency and the adhesion to the optical function layer and obtaining favorable optical characteristics.

The optical function layer 14 is a laminate that develops an antireflection function. The optical function layer 14 shown in FIG. 3 is a laminate of a total of four layers in which the high-refractive index layers 14*a* and the low-refractive index layers 14*b* are alternately laminated in order from the adhesion layer 13 side. The number of layers of the high-refractive index layers 14*a* and the low-refractive index layers 14*b* is not particularly limited, and the number of layers of the high-refractive index layers 14*a* and the low-refractive index layers 14*b* can be set to an arbitrary number of layers.

In the optical laminate 10 shown in FIG. 3, the optical function layer 14 is made of a laminate in which the low-refractive index layers 14*b* and the high-refractive index layers 14*a* are alternately laminated, and thus light incident from the antifouling layer 15 side is diffused by the optical function layer 14. Therefore, an antireflection function of preventing the light incident from the antifouling layer 15 side from being reflected in one direction can be obtained.

The low-refractive index layer 14*b* contains, for example, a metal oxide. The low-refractive index layer 14*b* may contain a Si oxide and is preferably a layer containing $SiO_2$ (Si oxide) as a main component from the viewpoint of easy procurement and the cost. A $SiO_2$ single-layer film is colorless and transparent. In the present embodiment, the main component of the low-refractive index layer 14*b* means a component in which the amount in the low-refractive index layer 14*b* is 50 mass % or more.

In a case where the low-refractive index layer 14*b* is a layer containing a Si oxide as the main component, the low-refractive index layer 14*b* may contain less than 50 mass % of a different element. The amount of the different element from the Si oxide is preferably 10% or less. As the different element, for example, Na can be contained for the purpose of improving the durability, Zr, Al or N can be contained for the purpose of improving the hardness, and Zr or Al can be contained for the purpose of improving the alkali resistance.

The refractive index of the low-refractive index layer 14*b* is preferably 1.20 to 1.60 and more preferably 1.30 to 1.50. As a dielectric body that is used in the low-refractive index layer 14*b*, magnesium fluoride ($MgF_2$, refractive index: 1.38) or the like is an exemplary example.

The refractive index of the high-refractive index layer 14*a* is preferably 2.00 to 2.60 and more preferably 2.10 to 2.45. Examples of a dielectric body that is used in the high-refractive index layer 14*a* include niobium pentoxide ($Nb_2O_5$, refractive index: 2.33), titanium oxide ($TiO_2$, refractive index: 2.33 to 2.55), tungsten oxide ($WO_3$, refractive index: 2.2), cerium oxide ($CeO_2$, refractive index: 2.2), tantalum pentoxide ($Ta_2O_5$, refractive index: 2.16), zinc oxide (ZnO, refractive index: 2.1), indium tin oxide (ITO, refractive index: 2.06), zirconium oxide ($ZrO_2$, refractive index: 2.2) and the like.

In a case where it is desired to impart a conductive characteristic to the high-refractive index layer 14*a*, it is possible to select, for example, ITO and indium oxide zinc oxide (IZO).

In the optical function layer 14, it is preferable to use, for example, a layer made of niobium pentoxide ($Nb_2O_5$, refractive index: 2.33) as the high-refractive index layer 14*a* and a layer made of $SiO_2$ as the low-refractive index layer 14*b*.

The film thickness of the low-refractive index layer 14*b* needs to be in a range of 1 nm or more and 200 nm or less and is selected as appropriate depending on a wavelength region where the antireflection function is required.

The film thickness of the high-refractive index layer 14*a* needs to be, for example, 1 nm or more and 200 nm or less and is selected as appropriate depending on a wavelength region where the antireflection function is required.

The film thickness of each of the high-refractive index layer 14*a* and the low-refractive index layer 14*b* can be selected as appropriate depending on the design of the optical function layer 14.

For example, it is possible to provide a 5 to 50 nm-thick high-refractive index layer 14*a*, a 10 to 80 nm-thick low-refractive index layer 14*b*, a 20 to 200 nm-thick high-refractive index layer 14*a* and a 50 to 200 nm-thick low-refractive index layer 14*b* in order from the adhesion layer 13 side.

Between the layers that form the optical function layer 14, the low-refractive index layer 14*b* is disposed on the antifouling layer 15 side. In a case where the low-refractive index layer 14*b* of the optical function layer 14 is in contact with the antifouling layer 15, the antireflection performance of the optical function layer 14 becomes favorable, which is preferable.

The antifouling layer 15 is formed on the outermost surface of the optical function layer 14 and prevents defacement of the optical function layer 14. In addition, the antifouling layer 15 suppresses wear of the optical function layer 14 with the wear resistance when being applied to touch panels and the like.

The antifouling layer 15 of the present embodiment is made of a vapor-deposited film obtained by vapor deposition of an antifouling material. In the present embodiment, the antifouling layer 15 is formed on one surface of the low-refractive index layer 14*b* configuring the optical function layer 14 by vacuum vapor deposition of a fluorine-based organic compound as the antifouling material. In the present embodiment, the antifouling material contains a fluorine-based organic compound, and thus the optical laminate 10 has more favorable friction resistance and alkali resistance.

As the fluorine-based organic compound configuring the antifouling layer 15, a compound made up of a fluorine-modified organic group and a reactive silyl group (for example, alkoxysilane) is preferably used. As a commercially available product, OPTOOL DSX (manufactured by Daikin Industries, Ltd.), KY-100 series (manufactured by Shin-Etsu Chemical Co., Ltd.) and the like are exemplary examples.

In a case where a compound made up of a fluorine-modified organic group and a reactive silyl group (for example, alkoxysilane) is used as the fluorine-based organic compound configuring the antifouling layer 15 and a layer made of $SiO_2$ is used as the low-refractive index layer 14*b* of the optical function layer 14 in contact with the antifouling layer 15, a siloxane bond is formed between a silanol group, which is the skeleton of the fluorine-based organic compound, and $SiO_2$. Therefore, the adhesion between the optical function layer 14 and the antifouling layer 15 becomes favorable, which is preferable.

The optical thickness of the antifouling layer 15 needs to be in a range of 1 nm or more and 20 nm or less and is preferably in a range of 2.5 nm or more and 10 nm or less. When the thickness of the antifouling layer 15 is 1 nm or more, it is possible to sufficiently secure wear resistance when the optical laminate 10 is applied to a touch panel use and the like. In addition, when the thickness of the antifouling layer 15 is 3 nm or more, the liquid resistance or the like of the optical laminate 10 improves. In addition, when the thickness of the antifouling layer 15 is 20 nm or less, a time necessary for vapor deposition becomes a short time, which makes it possible to efficiently produce the antifouling layer.

The surface roughness Ra of the antifouling layer 15 differs depending on the use or configuration of the optical laminate. For example, in the case of a transparent antireflection layer not having an antiglare function (clear type antireflection film), the surface roughness Ra of the antifouling layer 15 is, for example, preferably 3 nm or more and more preferably 5 nm or more. The upper limit is not particularly limited, but is preferably 10 nm or less from the viewpoint of, for example, the scratch resistance. On the other hand, in the case of an antireflection layer having an antiglare function (AG type antireflection film), the surface roughness is, for example, preferably 10 nm or more and more preferably 30 nm or more. The surface roughness Ra of the antifouling layer mentioned herein reflects the surface roughness of the optical function layer 14. The surface roughness is a value before a test such as a scratch resistance test is performed.

The antifouling layer 15 differs depending on the use or configuration of the optical laminate. For example, in a case where the optical laminate is an antireflection layer having an antiglare function (AG type antireflection film), the average length of elements RSm of the antifouling layer 15 is, for example, preferably 55 nm or more and more preferably 90 nm or less. The average length of elements RSm of the antifouling layer mentioned herein reflects the average length of elements of the optical function layer 14. The average length of elements RSm of the antifouling layer 15 mentioned here is a value before the scratch resistance test is performed.

The antifouling layer 15 may contain additives such as a light stabilizer, a UV absorber, a colorant, an antistatic agent, a lubricant, a leveling agent, a defoamer, an antioxidant, a flame retardant, an infrared absorber and a surfactant as necessary.

The antifouling layer 15 formed by vapor deposition strongly bonds to the optical function layer 14 by the formation of a chemical bond or an anchor effect attributed to the roughness of the optical function layer, has only a small number of cavities and is dense. This makes the antifouling layer 15 of the present embodiment exhibit favorable characteristics unlike antifouling layers formed by a conventional method such as the application of an antifouling material.

For example, the antifouling layer 15 in the clear type optical laminate 10 of the present embodiment has the following characteristics.

(1) The contact angle difference with respect to water after an abrasion test where a steel wool is horizontally and reciprocally moved 500 times is 12° or less.

(2) The contact angle with respect to water after an abrasion test where a steel wool is horizontally and reciprocally moved 500 times is 109° or more.

(3) The contact angle with respect to water after an abrasion test where a waste cloth (nonwoven wiper) is reciprocated 4000 times is 100° or more.

(4) The change amount (ΔE value) of the L*a*b* value represented by the following formula (3) by SCI (specular component include, a measurement method of reflected color in consideration of specular light) after an abrasion test where a steel wool is horizontally and reciprocally moved 500 times is 3.0 or less.

[Math. 1]

$$\Delta E=\Delta(L^*a^*b^*)=\sqrt{(L1^*-L0^*)^2+(a1^*-a0^*)^2+(b1^*-b0^*)^2} \qquad \text{Formula (3)}$$

(In the formula (3), L0*, a0* and b0* are values before the abrasion test, and L1*, a1* and b1* are values after the abrasion test.)

(5) The change amount (ΔE value) of the L*a*b* value represented by the following formula (4) by SCE (specular component exclude, a measurement method of reflected color not in consideration of specular light)

after an abrasion test where a steel wool is horizontally and reciprocally moved 500 times is 0.5 or less.

[Math. 2]

$$\Delta E=\Delta(L^*a^*b^*)=\sqrt{(L1^*-L0^*)^2+(a1^*-a0^*)^2+(b1^*-b0^*)^2} \quad \text{Formula (4)}$$

(In the formula (4), L0*, a0* and b0 are values before the abrasion test, and L1*, a1* and b1* are values after the abrasion test.)

(6) The fluorine survival rate measured by X-ray fluorescence analysis (XRF) after immersion in a NaOH solution having a concentration of 0.1 mol/L (liquid temperature: 55° C.) for four hours is 85% or more.

(7) The contact angle difference with respect to water before and after the abrasion test where the waste cloth (nonwoven wiper) is reciprocated 4000 times is 12° or less.

(8) The fluorine survival rate measured by X-ray fluorescence analysis (XRF) after application of ultrasonic waves in a fluorine-based solvent at 40 KHz and 240 W for 10 minutes is 70% or more.

(9) The water vapor transmission rate is 1.5 g/($m^2$·1 day) or less.

In addition, for example, the antifouling layer 15 in the AG type optical laminate of the present embodiment has the following characteristics.

(1) The contact angle difference with respect to water before and after an abrasion test where a waste cloth (nonwoven wiper) is reciprocated 4000 times is 7° or less.

(2) The change amount (ΔE value) of the L*a*b* value represented by the formula (2) after immersion in a NaOH solution having a concentration of 0.1 mol/L (liquid temperature: 55° C.) for four hours is 5.0 or less.

(3) The fluorine survival rate measured by X-ray fluorescence analysis (XRF) after immersion in a NaOH solution having a concentration of 0.1 mol/L (liquid temperature: 55° C.) for four hours is 90% or more.

(4) The fluorine survival rate measured by X-ray fluorescence analysis (XRF) after application of ultrasonic waves in a fluorine-based solvent at 40 KHz and 240 W for 10 minutes is 75% or more.

(5) The water vapor transmission rate is 1.5 g/($m^2$·1 day) or less.

The optical laminate 10 including the antifouling layer 15 of the present embodiment formed by vapor deposition has a small number of cavities and is formed to be dense compared with antifouling layers formed by coating. In addition, in the optical laminate 10 of the present embodiment, the antifouling layer 15 strongly joins to the low-refractive index layer 14*b* in contact with the antifouling layer 15. Therefore, the optical laminate 10 of the present embodiment has an excellent visible light-transmitting property and is capable of maintaining high wear resistance to repetitive friction and also capable of maintaining high resistance with respect to alkali resistance.

[Production Method for Optical Laminate]

The optical laminate 10 of the present embodiment shown in FIG. 3 can be produced by, for example, a method to be described below.

In the present embodiment, as an example of the production method for the optical laminate 10, a case where the optical laminate 10 is produced using the transparent base material 11 wound in a roll shape will be described as an example.

First, the transparent base material 11 wound in a roll shape is unwound. In addition, a slurry containing a material that is to be the hardcoat layer 12 is applied onto the transparent base material 11 by a well-known method and cured by a well-known method. This forms the hardcoat layer 12 (hardcoat layer formation step). After that, the transparent base material 11 having the hardcoat layer 12 formed on the surface is wound in a roll shape by a well-known method.

Next, an adhesion layer formation step of forming the adhesion layer 13 on the hardcoat layer 12 and an optical function layer formation step of forming the optical function layer 14 are performed. After that, an antifouling layer formation step of forming the antifouling layer 15 on the optical function layer 14 is performed. In the present embodiment, it is preferable to perform a first surface treatment step of treating the surface of the hardcoat layer 12 before the optical function layer formation step and then perform the adhesion layer formation step and the optical function layer formation step. In addition, in the present embodiment, it is preferable to perform a second surface treatment step of treating the surface of the optical function layer 14 after the optical function layer formation step and then perform the antifouling layer formation step.

In the production method for the optical laminate 10 of the present embodiment, it is preferable to continuously perform the first surface treatment step, the adhesion layer formation step, the optical function layer formation step, the second surface treatment step and the antifouling layer formation step while an optical laminate in the middle of production is maintained in a reduced pressure state. In a case where the first surface treatment step, the adhesion layer formation step, the optical function layer formation step, the second surface treatment step and the antifouling layer formation step are continuously performed while the optical laminate in the middle of production is maintained in a reduced pressure state, for example, it is possible to use a device including a thin film formation device described in Patent Document 4 or the like as a sputtering device.

Figure 4:
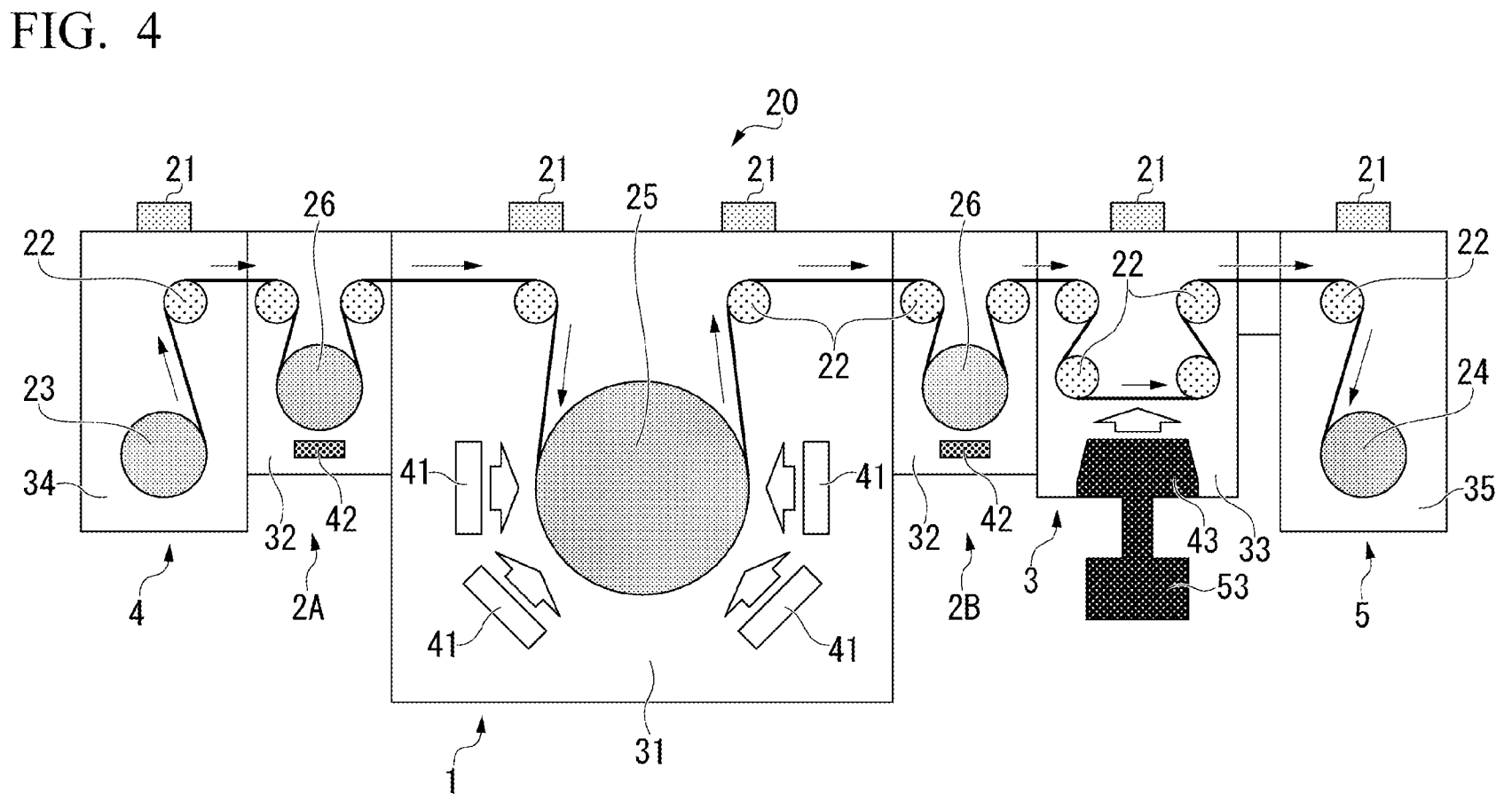

As a production device that can be used in the production method for an optical laminate of the present embodiment, specifically, a production device 20 shown in FIG. 4 is an exemplary example.

The production device 20 shown in FIG. 4 includes a roll unwinding device 4, a pretreatment device 2A, a sputtering device 1, a pretreatment device 2B, a vapor deposition device 3 and a roll winding device 5. As shown in FIG. 4, these devices 4, 2A, 1, 2B, 3 and 5 are linked in this order. The production device 20 shown in FIG. 4 is a roll-to-roll fashion production device in which a base material is unwound from a roll, continuously passed through the linked devices (in FIG. 4, the pretreatment device 2A, the sputtering device 1, the pretreatment device 2B and the vapor deposition device 3) and then wound, thereby continuously forming a plurality of layers on the base material.

In the case of producing the optical laminate 10 using the roll-to-roll fashion production device, it is possible to appropriately set the transport speed (line speed) of the optical laminate 10 in the middle of production. The transport speed is, for example, preferably set to 0.5 to 20 m/min. and more preferably set to 0.5 to 10 m/min.

<Roll Unwinding Device>

The roll unwinding device 4 shown in FIG. 4 has a chamber 34 in which a predetermined reduced pressure atmosphere has been formed, one or a plurality of vacuum pumps 21 (one in FIG. 4) that discharges gas in the chamber 34 to form the reduced pressure atmosphere, a unwinding roll 23 and a guide roll 22 installed in the chamber 34. As shown in FIG. 4, the chamber 34 is linked to a chamber 31 of the sputtering device 1 through the pretreatment device 2A.

The transparent base material 11 having the hardcoat layer 12 formed on the surface is wound around the unwinding roll 23. The unwinding roll 23 supplies the transparent base material 11 having the hardcoat layer 12 formed on the surface to the pretreatment device 2A at a predetermined transport speed.

<Pretreatment Device 2A>

The pretreatment device 2A shown in FIG. 4 has a chamber 32 in which a predetermined reduced pressure atmosphere has been formed, a can roll 26, a plurality of guide rolls 22 (two in FIG. 4) and a plasma discharge device 42. As shown in FIG. 4, the can roll 26, the guide rolls 22 and the plasma discharge device 42 are installed in the chamber 32. As shown in FIG. 4, the chamber 32 is linked to the chamber 31 of the sputtering device 1.

The can roll 26 and the guide rolls 22 transport the transparent base material 11 on which the hardcoat layer 12 has been formed sent from the roll unwinding device 4 at a predetermined transport speed and send out the transparent base material 11 having the hardcoat layer 12 with a treated surface to the sputtering device 1.

The plasma discharge device 42 is disposed to face the outer circumferential surface of the can roll 26 at a predetermined interval as shown in FIG. 4. The plasma discharge device 42 ionizes gas by a glow discharge. The gas is preferably a gas that is inexpensive and inactive and does not affect the optical characteristics, and, for example, an argon gas, an oxygen gas, a nitrogen gas, a helium gas and the like can be used. In the present embodiment, as the gas, an argon gas or an oxygen gas is preferably used.

<Sputtering Device>

The sputtering device 1 shown in FIG. 4 has the chamber 31 in which a predetermined reduced pressure atmosphere has been formed, one or a plurality of vacuum pumps 21 (two in FIG. 4) that discharges gas in the chamber 31 to form the reduced pressure atmosphere, a film formation roll 25, a plurality of guide rolls 22 (two in FIG. 4) and a plurality of film formation portions 41 (four in the example shown in FIG. 4). As shown in FIG. 4, the film formation roll 25, the guide rolls 22 and the film formation portions 41 are installed in the chamber 31. As shown in FIG. 4, the chamber 31 is linked to a chamber 32 of the pretreatment device 2B.

The film formation roll 25 and the guide rolls 22 transports the transparent base material 11 on which the hardcoat layer 12 having a treated surface has been formed sent from the pretreatment device 2A at a predetermined transport speed and supplies the transparent base material 11 having the adhesion layer 13 and the optical function layer 14 formed on the hardcoat layer 12 to the pretreatment device 2B.

In the sputtering device 1 shown in FIG. 4, the adhesion layer 13 is laminated by sputtering on the hardcoat layer 12 of the transparent base material 11, which travels on the film formation roll 25, and the high-refractive index layers 14*a* and the low-refractive index layers 14*b* are alternately laminated on the adhesion layer, thereby forming the optical function layer 14.

The film formation portion 41 is disposed to face the outer circumferential surface of the film formation roll 25 at a predetermined interval as shown in FIG. 4, and a plurality of the film formation portions is provided so as to surround the film formation roll 25. The number of the film formation portions 41 is determined depending on the total lamination number of the adhesion layer 13 and the high-refractive index layers 14*a* and the low-refractive index layers 14*b* forming the optical function layer 14. In a case where it is difficult to secure the distance between the adjacent film formation portions 41 since the total lamination number of the adhesion layer 13 and the high-refractive index layers 14*a* and the low-refractive index layers 14*b* forming the optical function layer 14 is large, a plurality of the film formation rolls 25 may be provided in the chamber 31, and the film formation portion 41 may be disposed in the vicinity of each film formation roll 25. In a case where a plurality of the film formation rolls 25 is provided, the guide rolls 22 may be further provided as necessary. A plurality of the chambers 31 in which the film formation roll 25 and the film formation portion 41 are provided may be linked together. In addition, the diameter of the film formation roll 25 may be changed as appropriate in order to make it easy to secure the distance between the adjacent film formation portions 41.

A predetermined target (not shown) is installed in each film formation portion 41. A voltage is applied to the target with a well-known structure. In the present embodiment, a gas supply portion (not shown) that supplies predetermined reactive gas and carrier gas to the target at a predetermined flow rate and a well-known magnetic field generation source (not shown) that forms a magnetic field on the surface of the target are provided in the vicinity of the target.

The material of the target and the kind and flow rate of the reactive gas are determined as appropriate depending on the compositions of the adhesion layer 13, the high-refractive index layer 14*a* and the low-refractive index layer 14*b* that are formed on the transparent base material 11 by being passed through the film formation portions 41 and the film formation roll 25. For example, in the case of forming a layer made of $SiO_2$, Si is used as the target, and $O_2$ is used as the reactive gas. In addition, for example, in the case of forming a layer made of $Nb_2O_5$, Nb is used as the target, and $O_2$ is used as the reactive gas. The low-refractive index layer 14*b* is preferably formed at a degree of vacuum of less than 0.5 Pa, and the high-refractive index layer 14*a* is preferably formed at a degree of vacuum of less than 1.0 Pa. When these layers are formed at such degrees of vacuum, the optical function layer 14 becomes dense, the water vapor transmission rate decreases, and the durability or the like improves.

In the present embodiment, a magnetron sputtering method is preferably used as a sputtering method from the viewpoint of increasing the film formation speed.

The sputtering method is not limited to the magnetron sputtering method, and a diode sputtering method in which plasma generated by a direct glow discharge or a high frequency is used, a triode sputtering method in which a hot cathode is added or the like may also be used.

The sputtering device 1 includes an optical monitor (not shown) as a measurement portion that measures optical characteristics after individual layers that are to be the adhesion layer 13 and the optical function layer 14 are formed. This makes it possible to check the qualities of the formed adhesion layer 13 and optical function layer 14. In a case where the sputtering device 1 has, for example, two or more chambers, the optical monitor is preferably installed in each chamber.

As the optical monitor (not shown), for example, an optical monitor that measures the optical characteristics in the width direction of the adhesion layer 13 and the optical function layer 14 formed on the hardcoat layer 12 with an optical head capable of scanning in the width direction is an exemplary example. In a case where such an optical monitor is provided, it is possible to measure the optical thickness distribution in the width direction of the adhesion layer 13 and the optical function layer 14 by, for example, measuring the peak wavelengths of reflectivity and converting the peak wavelengths to optical thicknesses as an optical characteristic. When optical characteristics are measured using the optical monitor, it is possible to form the optical laminate 10 including the adhesion layer 13 and the optical function layer 14 having optimal optical characteristics while the sputtering conditions are adjusted in real time.

<Pretreatment Device 2B>

The pretreatment device 2B shown in FIG. 4 has the chamber 32 in which a predetermined reduced pressure atmosphere has been formed, a can roll 26, a plurality of guide rolls 22 (two in FIG. 4) and a plasma discharge device 42. As shown in FIG. 4, the can roll 26, the guide rolls 22 and the plasma discharge device 42 are installed in the chamber 32. As shown in FIG. 4, the chamber 32 is linked to a chamber 33 of the vapor deposition device 3.

The can roll 26 and the guide rolls 22 transport the transparent base material 11 on which individual layers for up to the optical function layer 14 have been formed sent from the sputtering device 1 at a predetermined transport speed and send out the transparent base material 11 having the optical function layer 14 with a treated surface to the vapor deposition device 3. As the plasma discharge device 42, for example, the same device as in the pretreatment device 2A can be used.

<Vapor Deposition Device>

The vapor deposition device 3 shown in FIG. 4 has the chamber 33 in which a predetermined reduced pressure atmosphere has been formed, one or a plurality of vacuum pumps 21 (one in FIG. 4) that discharges gas in the chamber 33 to form the reduced pressure atmosphere, a plurality of guide rolls 22 (four in FIG. 4), a vapor deposition source 43 and a heating device 53. As shown in FIG. 4, the guide rolls 22 and the vapor deposition source 43 are installed in the chamber 33. The chamber 33 is linked to a chamber 35 of the roll winding device 5.

The vapor deposition source 43 is disposed to face the transparent base material 11 having the optical function layer 14 with a treated surface, which is substantially horizontally transported between two adjacent guide rolls 22. The vapor deposition source 43 supplies an evaporation gas made of a material that is to be the antifouling layer 15 onto the optical function layer 14. The orientation of the vapor deposition source 43 can be arbitrarily set.

The heating device 53 heats the material that is to be the antifouling layer 15 to a vapor pressure temperature. As the heating device 53, it is possible to use a heating device that heats the material by a resistance heating method, a heater heating method, an induction heating method or an electron beam method or the like. In the resistance heating method, energization heating is performed on a container accommodating the antifouling material that is to be the antifouling layer 15 as a resistor. In the heater heating method, the container is heated with a heater disposed on the outer circumference of the container. In the induction heating method, the container or the antifouling material is heated by an electromagnetic induction action from an induction coil installed outside.

The vapor deposition device 3 shown in FIG. 4 includes a guide plate (not shown) that guides a vapor deposition material evaporated in the vapor deposition source 43 to a predetermined position, a film thickness meter (not shown) that observes the thickness of the antifouling layer 15 formed by vapor deposition, a vacuum pressure gauge (not shown) that measures the pressure in the chamber 33 and a power supply device (not shown).

The guide plate may have any shape as long as the evaporated vapor deposition material can be guided to a desired position. The guide plate may not be provided if not necessary.

As the vacuum pressure gauge, for example, an ion gauge or the like can be used.

As the power supply device, for example, a high-frequency power supply or the like is an exemplary example.

<Roll Winding Device>

The roll winding device 5 shown in FIG. 4 has the chamber 35 in which a predetermined reduced pressure atmosphere has been formed, one or a plurality of vacuum pumps 21 (one in FIG. 4) that discharges gas in the chamber 35 to form the reduced pressure atmosphere, a winding roll 24 and a guide roll 22 installed in the chamber 35.

The transparent base material 11 on which individual layers for up to the antifouling layer 15 have been formed on the surface (optical laminate 10) is wound around the winding roll 24. The winding roll 24 and the guide roll 22 wind the optical laminate 10 at a predetermined winding speed.

A carrier film may be used as necessary.

As the vacuum pumps 21 that are provided in the production device 20 shown in FIG. 4, it is possible to use, for example, dry pumps, oil rotary pumps, turbomolecular pumps, oil diffusion pumps, cryopumps, sputter ion pumps, getter pumps and the like. The vacuum pumps 21 can be selected as appropriate or used in combination to generate a desired reduced pressure state in each of the chambers 31, 32, 33, 34 and 35.

The vacuum pumps 21 need to be capable of maintaining both the chamber 31 of the sputtering device 1 and the chamber 33 of the vapor deposition device 3 in a desired reduced pressure state, and the installation positions and number of the vacuum pumps 21 in the production device 20 are not particularly limited. In addition, in the production device 20 shown in FIG. 4, the roll unwinding device 4, the pretreatment device 2A, the sputtering device 1, the pretreatment device 2B, the vapor deposition device 3 and the roll winding device 5 are linked together. Therefore, the vacuum pumps 21 may be installed in each of the chambers 31, 32, 33, 34 and 35 and may be installed only in some chambers of the chambers 31, 32, 33, 34 and 35 as long as both the chamber 31 of the sputtering device 1 and the chamber 33 of the vapor deposition device 3 can be maintained in a desired reduced pressure state.

Next, a method in which the first surface treatment step, the adhesion layer formation step, the optical function layer formation step, the second surface treatment step and the antifouling layer formation step are continuously performed while the optical laminate 10 in the middle of production is maintained in a reduced pressure state using the production device 20 shown in FIG. 4 will be described.

First, the unwinding roll 23 around which the transparent base material 11 having the hardcoat layer 12 formed on the surface has been wound is installed in the chamber 34 of the roll unwinding device 4. In addition, the unwinding roll 23 and the guide roll 22 are rotated to send out the transparent base material 11 having the hardcoat layer 12 formed on the surface to the pretreatment device 2A at a predetermined transport speed.

Next, the first surface treatment step is performed as a pretreatment on the surface on which the adhesion layer 13 and the optical function layer 14 are to be formed in the chamber 32 of the pretreatment device 2A. In the present embodiment, the first surface treatment step is performed on the transparent base material 11 on which the hardcoat layer 12 has been formed.

In the first surface treatment step, the surface of the hardcoat layer 12, which travels on the can roll 26, is treated while the transparent base material 11 on which the hardcoat layer 12 has been formed is transported at a predetermined transport speed by rotating the can roll 26 and the guide rolls 22.

As a surface treatment method for the hardcoat layer 12, it is possible to use, for example, a glow discharge treatment, a plasma treatment, ion etching, an alkali treatment or the like. Among these, a glow discharge treatment is preferably used since a large area treatment is possible. The glow discharge treatment can be performed with a treatment intensity of, for example, 0.1 to 10 kwh.

The glow discharge treatment that is performed on the surface of the hardcoat layer 12 roughens the surface of the hardcoat layer 12 on a nano level and removes a substance having a weak bonding force present on the surface of the hardcoat layer 12. As a result, the adhesion between the hardcoat layer 12 and the optical function layer 14 that is to be formed on the hardcoat layer 12 becomes favorable.

Next, the adhesion layer formation step and the optical function layer formation step are performed in the chamber 31 of the sputtering device 1. Specifically, the adhesion layer 13 and the optical function layer 14 are formed on the hardcoat layer 12, which travels on the film formation roll 25, while the transparent base material 11 on which the hardcoat layer 12 has been formed is transported at a predetermined transport speed by rotating the film formation roll 25 and the guide rolls 22.

In the present embodiment, by sputtering during which the material of the target that is installed in each film formation portion 41 or the kind and flow rate of the reactive gas that is supplied from the gas supply portion are changed, the adhesion layer 13 is formed, and the high-refractive index layers 14*a* and the low-refractive index layers 14*b* are alternately laminated on the adhesion layer. That is, the adhesion layer formation step and the optical function layer formation step are continuously performed in the sputtering device 1. This forms the adhesion layer 13 and the optical function layer 14, which is an antireflection layer.

The high-refractive index layers 14*a* and the low-refractive index layers 14*b* are each formed under a condition of a predetermined degree of vacuum or less. Specifically, the high-refractive index layer 14*a* is formed at a degree of vacuum of less than 1.0 Pa, and the low-refractive index layer 14*b* is formed at a degree of vacuum of less than 0.5 Pa.

In a case where a SiOx film is formed as the adhesion layer 13, the SiOx film is preferably formed by reactive sputtering with a gas mixture atmosphere of an oxygen gas and an argon gas using a silicon target.

In a case where the adhesion layer 13, the high-refractive index layers 14*a* and the low-refractive index layers 14*b* are continuously laminated by sputtering, the layers may be formed with the material of the target being changed for the formation of the adhesion layer 13, for the formation of the high-refractive index layer 14*a* and for the formation of the low-refractive index layer 14*b*. In addition, for example, layers made of the target material and layers made of an oxide of the target material may be alternately formed using one kind of a material as the target with the oxygen (reactive gas) flow rate being changed during sputtering and may be used as the adhesion layer 13, the high-refractive index layers 14*a* and the low-refractive index layers 14*b*.

The pressure during sputtering for forming the adhesion layer 13 and the optical function layer 14 differs depending on a metal to be sputtered, but may be 2 Pa or less and is preferably 1 Pa or less, more preferably 0.6 Pa or less and particularly preferably 0.2 Pa or less. When the pressure during sputtering is in a reduced pressure state of 1 Pa or less, a mean free pass of film formation molecules becomes long, and the layers are laminated while the energies of the film formation molecules are high, and thus the film qualities become dense and more favorable. The pressures during the sputtering of the high-refractive index layer and the low-refractive index layer are preferably different from each other. This is because the mean free pass differs depending on film formation species. The pressure changes for each film formation species, whereby denser films can be formed.

After that, the transparent base material 11 having the adhesion layer 13 and the optical function layer 14 formed on the hardcoat layer 12 is sent out to the pretreatment device 2B by rotating the film formation roll 25 and the guide rolls 22.

Next, the second surface treatment step is performed as a pretreatment on the surface on which the antifouling layer 15 is to be formed in the chamber 32 of the pretreatment device 2B. In the present embodiment, the second surface treatment step is continuously performed while the transparent base material 11 on which the optical function layer 14 has been formed obtained by the optical function layer formation step is maintained in a reduced pressure state without being exposed to the atmosphere.

In the second surface treatment step, a discharge treatment is performed on the surface of the optical function layer 14, which travels on the can roll 26, while the transparent base material 11 on which individual layers for up to the optical function layer 14 have been formed is transported at a predetermined transport speed by rotating the can roll 26 and the guide rolls 22.

As a surface treatment method for the optical function layer 14, it is possible to use, for example, a glow discharge treatment, a plasma treatment, ion etching, an alkali treatment or the like. Among these, a glow discharge treatment is preferably used since a large area treatment is possible.

When the discharge treatment is performed on the surface of the optical function layer 14, the surface of the optical function layer 14 is etched, and the surface state of the optical function layer 14 changes. The surface state of the optical function layer 14 is represented by surface roughness Ra or the average length of elements RSm. For example, in a case where the optical function layer 14 is a clear type antireflection film having haze of 2.0 or less, it is easy to define the surface state of the optical function layer 14 with surface roughness Ra. In addition, for example, in a case where the optical function layer 14 is an AG type antireflection film having haze of more than 2.0, it is easy to define the surface state of the optical function layer 14 with the average length of elements RSm. The surface roughness or average length of elements of the optical function layer can be evaluated with surface roughness Ra or the average length of elements RSm after the formation of the antifouling layer. The surface roughness Ra or the average length of elements RSm are measured based on JIS B 0601 (ISO 4287).

The integrated output at the time of the glow discharge treatment is preferably 130 W·min/m$^2$ or more and 2000 W·min/m$^2$ or less. The surface state of the optical function layer 14 changes due to the integrated output at the time of the glow discharge treatment. In the present embodiment, the integrated output is a value obtained by dividing the product of the glow discharge output and the irradiation time with which the optical function layer 14 has been irradiated by the unit area at the time of the discharge treatment.

The conditions of the discharge treatment can be set as appropriate. When the conditions of the discharge treatment are set as appropriate, the adhesion between the optical function layer 14 and the antifouling layer 15 that is formed on the optical function layer becomes favorable, and an optical laminate 10 having more favorable friction resistance and alkali resistance can be obtained.

The surface roughness Ra and average length of elements RSm of the optical function layer 14 after the discharge treatment differ depending on the surface roughness and average length of elements RSm of the hardcoat layer 12 that is provided below the optical function layer 14.

In addition, the surface roughness Ra and average length of elements RSm of the optical function layer 14 after the discharge treatment affect the surface roughness Ra and average length of elements RSm of the antifouling layer 15 that is formed on the optical function layer 14. Therefore, in a case where the surface roughness Ra or average length of elements RSm of the optical function layer is evaluated with the surface roughness Ra or average length of elements RSm after the formation of the antifouling layer, it is necessary to arrange and compare conditions other than the discharge treatment.

In the second surface treatment step, the surface of the optical function layer is treated so that, for example, the change rate of surface roughness represented by the following (formula 1) reaches 5% to 35%. Particularly, in the case of the clear type antireflection film, the surface of the optical function layer is treated under this condition.

$$\text{Change rate (\%) of surface roughness} = ((Ra2/Ra1)-1)\times 100(\%) \quad \text{Formula (1)}$$

(in the formula (1), Ra1 indicates the surface roughness (Ra) of the antifouling layer in the optical laminate in which the antifouling layer has been formed without performing a surface treatment, and Ra2 indicates the surface roughness (Ra) of the antifouling layer in the optical laminate in which the surface has been treated and then the antifouling layer has been formed)

The second surface treatment step is performed so that the change rate of surface roughness represented by (Formula 1) preferably reaches 5% to 35% and more preferably reaches 10% to 30%. When the change rate of surface roughness represented by (Formula 1) is 5% or more, the second surface treatment step makes an effect of improving the adhesion between the optical function layer 14 and the antifouling layer 15 significant. In addition, when the change rate of surface roughness represented by (Formula 1) is 35% or less, it is possible to maintain the optical characteristics after a durability test, which is preferable.

In addition, in the second surface treatment step, the surface of the optical function layer is treated so that the change rate of the average length of elements represented by the following formula reaches 7% to 65%. Particularly, in the case of the Ag type antireflection film, the surface of the optical function layer is treated under this condition. For example, the integrated output at the time of the discharge treatment is one parameter that affects the average length of elements.

$$\text{Change rate (\%) of average length of elements} = ((RSm2/RSm1)-1)\times 100(\%) \quad \text{Formula (2)}$$

(In the formula (2), RSm1 indicates the average length of elements (RSm) of the antifouling layer in the optical laminate in which the antifouling layer has been formed without performing a surface treatment, and RSm2 indicates the average length of elements (RSm) of the antifouling layer in the optical laminate in which the surface has been treated and then the antifouling layer has been formed.)

The second surface treatment step is performed so that the change rate of the average length of elements (RSm) represented by the formula (2) preferably reaches 7% to 70% and more preferably reaches 10% to 65%. When the change rate of the average length of elements represented by the formula (2) is within the above-described range, the second surface treatment step makes an effect of improving the adhesion between the optical function layer 14 and the antifouling layer 15 significant. In addition, when the change rate of the average length of elements represented by the formula (2) is a predetermined value or less, it is possible to maintain the optical characteristics after a durability test, which is preferable.

In the present embodiment, the surface roughness Ra and average length of elements of the antifouling layer 15 can be measured using an atomic force microscope (AFM). The surface roughness Ra is measured in an area range of 1 $\mu m^2$ on the surface of the antifouling layer 15, and the average length of elements RSm is measured in an area range of 0.5 $\mu m^2$ on the surface of the antifouling layer 15.

After that, the transparent base material 11 having the optical function layer 14 with a treated surface is sent out to the vapor deposition device 3 by rotating the can roll 26 and the guide rolls 22.

Next, the antifouling layer formation step is performed in the chamber 33 of the vapor deposition device 3. In the present embodiment, the antifouling layer formation step is continuously performed while the transparent base material 11 having the optical function layer 14 with a treated surface obtained by the second surface treatment step is maintained in a reduced pressure state without being exposed to the atmosphere.

In the antifouling layer formation step, the vapor deposition source 43 is vapor-deposited on the surface of the optical function layer 14 while the transparent base material 11 having the optical function layer 14 with a treated surface is transported at a predetermined transport speed by rotating the guide rolls 22.

In the present embodiment, for example, the antifouling material made of the fluorine-based organic compound, which is to be the antifouling layer 15, is heated to a vapor deposition temperature with the heating device 53, an obtained evaporation gas is supplied from the vapor deposition source 43 in a reduced pressure environment and attached to the optical function layer 14 with a treated surface, and the antifouling layer is formed by vacuum vapor deposition.

The pressure at the time of performing the vacuum vapor deposition of the antifouling layer 15 is, for example, preferably 0.05 Pa or less, more preferably 0.01 Pa or less and particularly preferably 0.001 Pa or less. When the pressure at the time of performing the vacuum vapor deposition is in a reduced pressure state of 0.05 Pa or less, the mean free pass of film formation molecules becomes long, and the vapor deposition energy becomes high, and thus a dense and more favorable antifouling layer 15 can be obtained.

The optical laminate 10 having the antifouling layer 15 formed by vapor vacuum deposition on the adhesion layer 13 and the optical function layer 14 formed by sputtering is obtained by the above-described method. In the antifouling layer 15 after film formation, the initial amount of fluorine measured using X-ray fluorescence analysis (XRF) is preferably 0.03 or more.

After that, the transparent base material 11 on which individual layers for up to the antifouling layer 15 have been formed (optical laminate 10) is sent out to the roll winding device 5 by rotating the guide rolls 22.

In addition, the optical laminate 10 is wound around the winding roll 24 by rotating the winding roll 24 and the guide roll 22 in the chamber 35 of the roll winding device 5.

In the present embodiment, it is preferable to continuously perform the optical function layer formation step and the antifouling layer formation step at reduced pressure. Particularly, in a case where the optical laminate 10 is continuously produced as a wound body in the roll-to-roll fashion as in the production method of the present embodiment where the production device 20 shown in FIG. 4 is used, it is more preferable to continuously perform the optical function layer formation step and the antifouling layer formation step in-line while a reduced pressure state is maintained. "In-line" means that the antifouling layer formation step is performed without exposing the optical function layer 14 formed in the optical function layer formation step to the atmosphere. When the optical function layer formation step and the antifouling layer formation step are continuously performed at reduced pressure, the generation of a natural oxide film on the optical function layer 14 formed in the optical function layer formation step before the formation of the antifouling layer 15 is suppressed. In addition, it is possible to prevent the adhesion between the optical function layer 14 and the antifouling layer 15 from being impaired by the attachment of contamination, such as a foreign substance, at the time of winding the roll onto the optical function layer 14. Therefore, compared with a case where, after the optical function layer formation step, the transparent base material 11 on which individual layers for up to the optical function layer 14 have been formed is removed from the chamber in a reduced pressure state and then installed again in the chamber and the antifouling layer formation step is performed at reduced pressure (a case of Example 4 to be described below), an optical laminate having favorable adhesion between the optical function layer 14 and the antifouling layer 15 and excellent transparency can be obtained.

In addition, the antifouling layer 15 in the optical laminate 10 of the present embodiment is a vapor-deposited film, and thus high wear resistance can be obtained compared with antifouling films formed by, for example, a coating method. This is assumed to arise from a reason to be described below. That is, in an antifouling film formed by the coating method, cavities attributed to a solvent that is contained in paint are present. In contrast, in a vapor-deposited film, there are no cavities attributed to a solvent. Therefore, it is assumed that, compared with the antifouling film formed by the coating method, the vapor-deposited film has a high density, and high wear resistance or alkali resistance can be obtained.

The production method for the optical laminate 10 of the present embodiment includes the adhesion layer formation step of forming the adhesion layer 13, the optical function layer formation step of forming the optical function layer 14 by alternately laminating the high-refractive index layers 14*a* and the low-refractive index layers 14*b*, the second surface treatment step of treating the surface of the optical function layer 14 and the antifouling layer formation step of forming the antifouling layer 15 on the optical function layer 14 having a treated surface. Therefore, the adhesion between the optical function layer 14 and the antifouling layer 15 formed on the optical function layer 14 is favorable, and the friction resistance and the alkali resistance become more favorable.

Particularly, in a case where, in the second surface treatment step, the surface of the optical function layer has been treated such that the change rate of surface roughness represented by the formula (1) reaches 5% to 35%, since the surface of the optical function layer 14 changes to appropriate roughness, and the surface is activated by etching, the reactiveness with the antifouling layer 15 that is to be formed on the optical function layer 14 improves, which is preferable.

In addition, in the production method for the optical laminate 10 of the present embodiment, since it is possible to continuously form the optical laminate 10 in the roll-to-roll fashion and to highly accurately control the film thicknesses, in the optical function layer formation step, it preferable to form the optical function layer 14 by sputtering.

In the present embodiment, in a case where the first surface treatment step, the optical function layer formation step, the second surface treatment step and the antifouling layer formation step are continuously performed while the optical laminate in the middle of production is maintained in a reduced pressure state, as long as there is no hindrance in each production step, for example, the reduced pressure conditions in the chambers may differ in the sputtering device and the vapor deposition device.

In the present embodiment, it is preferable to measure the film formation results over time with a measuring instrument and feedback the results to the conditions for a production step that is a subsequent step in any one or more steps of the adhesion layer formation step, the optical function layer formation step and the antifouling layer formation step. This makes it easy to optimize the characteristics of the entire optical laminate and makes it possible to uniform the characteristics in the surface of the optical laminate. In addition, it is also possible to perform the feedback of the production conditions in the same step with the measuring instrument. In this case, layers that have been formed by the step have uniform and stable characteristics.

In the present embodiment, a case where the second surface treatment step is performed between the optical function layer formation step and the antifouling layer formation step has been described as an example, but the second surface treatment step may or may not be performed as necessary. Even in a case where the second surface treatment step is not performed, it is preferable to continuously perform the optical function layer formation step and the antifouling layer formation step at reduced pressure.

In addition, in the production method of the present embodiment, the optical function layer is formed under a condition of a predetermined degree of vacuum or less. Therefore, the optical function layer 14 becomes dense, the water vapor transmission rate decreases, and the friction resistance and the alkali resistance improve. Furthermore, the film thickness of the antifouling layer is a predetermined thickness or more, which makes it possible to secure sufficient friction resistance and alkali resistance.

In the present embodiment, a case where the optical laminate 10 is continuously produced in the roll-to-roll fashion using the production device 20 shown in FIG. 4 including the pretreatment device 2A, the sputtering device 1, the pretreatment device 2B, the vapor deposition device 3, the roll unwinding device 4 and the roll winding device 5 has been described as an example, but the production device for producing the optical laminate 10 is not limited to the production device 20 shown in FIG. 4.

For example, a production device in which the pretreatment device 2A and the pretreatment device 2B are not included and the roll unwinding device 4, the sputtering device 1, the vapor deposition device 3 and the roll winding device 5 are linked in this order may also be used.

In the production device 20 shown in FIG. 4, a pretreatment chamber (not shown) for washing the surface of the optical function layer 14 on which the antifouling layer 15 is to be formed may be provided between the chamber 33 of the vapor deposition device 3 and the chamber 32 of the pretreatment device 2B.

In the production device 20 shown in FIG. 4, a post treatment chamber (not shown) for performing the cooling and/or inspection of the transparent base material 11 on which individual layers for up to the antifouling layer 15 have been formed may be provided between the chamber 33 of the vapor deposition device 3 and the chamber 35 of the roll winding device 5.

In the production device 20 shown in FIG. 4, a hardcoat layer formation device for forming the hardcoat layer 12 on the surface of the transparent base material 11 may be provided between the roll unwinding device 4 and the sputtering device 1. In this case, not only the optical function layer 14 and the antifouling layer 15 but also the hardcoat layer 12 can be continuously produced in the roll-to-roll fashion, which is preferable.

In the present embodiment, a case where the optical function layer formation step is performed using the sputtering device and the antifouling layer formation step is performed using the vapor deposition device has been described as an example; however, in a case where the second surface treatment step is not performed, the optical function layer formation step and the antifouling layer formation step may be performed with the same device (in one chamber).

In the optical laminate 10 of the present embodiment, a variety of layers may be provided as necessary on a surface of the transparent base material opposite to the surface on which the optical function layer and the like have been formed. For example, a pressure sensitive adhesive layer that is used for adhesion to other members may be provided. In addition, other optical films may also be provided through this pressure sensitive adhesive layer. Examples of the other optical films include films that function as a polarizing film, a phase difference compensation film, a half-wave plate and a quarter-wave plate and the like.

In addition, on the opposite surface of the transparent base material, layers having functions of antireflection, selective reflection, antiglare, polarization, phase difference compensation, viewing angle compensation or enlargement, light guide, diffusion, brightness improvement, hue adjustment, conduction and the like may be directly formed.

In addition, the shape of the optical laminate may be a flat shape or may be a shape having Moth-eye or a nano-order uneven structure that develops an antiglare function. In addition, the shape may be a micro to milli-order geometric shape such as a lens or a prism. The shape can be formed by, for example, a combination of photolithography and etching, shape transfer, hot pressing or the like. In the present embodiment, the films are formed by vapor deposition or the like, and thus, even in a case where the base material has, for example, an uneven shape, the uneven shape can be maintained.

An article of the present embodiment includes the above-described optical laminate 10 on a display surface of an image display portion, for example, a liquid crystal display panel, an organic EL display panel or the like. This makes it possible to impart high wear resistance and alkali resistance to, for example, touch panel display portions of smartphones or operation equipment and makes it possible to realize image display devices being excellent in terms of durability and suitable for actual use.

In addition, the article is not limited to image display devices and may be any article as long as the optical laminate 10 can be applied, for example, windshields or goggles having the optical laminate of the present embodiment on the surface, light-receiving surfaces of solar cells, screens of smartphones, displays of personal computers, information input terminals, tablet terminals, augmented reality (AR) devices, virtual reality (VR) devices, electronic display boards, glass table surfaces, amusement machines, operation support devices for aircraft, trains or the like, navigation systems, dashboards and optical sensor surfaces.

Hitherto, the embodiment of the present invention has been described, but this embodiment is proposed as an example and does not intend to limit the scope of the invention. This embodiment can be carried out in a variety of other forms and can be omitted, substituted or modified in a variety of manners within the scope of the gist of the invention. This embodiment or modification thereof is included in the invention described in the claims and the equivalent scope thereof in the same manner as being included in the scope or gist of the invention.

For example, instead of the hardcoat layer 12, an antiglare layer may be formed or an arbitrary functional layer, such as a flexible soft coat layer, can be added as necessary. These may also be laminated.

EXAMPLES

The effect of the present invention was verified.

Optical laminates that were made in the following examples and comparative examples are examples that function as antireflection films, and the gist of the present invention is not limited thereto.

Example 1

First, a photocurable resin composition in which the amount of silica particles (filler) having an average grain diameter of 50 nm was 28 mass % with respect to the entire solid content of the resin composition (binder resin) was prepared. The resin composition was prepared by dissolving the silica particles, an acrylate, a leveling agent and a photopolymerization initiator in a solvent as shown in Table 1.

TABLE 1

| | Product name | Maker | Structure | Blending ratio |
|---|---|---|---|---|
| Acrylate | CN968 | Sartomer | Urethane acrylate oligomer | 8% |
| | SR444 | Sartomer | Pentaerythritol triacrylate | 7% |
| | SR610 | Sartomer | Polyethylene glycol (600) diacrylate | 11% |

TABLE 1-continued

| | Product name | Maker | Structure | Blending ratio |
|---|---|---|---|---|
| Silica particle | IPA-ST-L | Nissan Chemical Corporation | Silica sol having grain diameter of 40 to 50 nm (solid content: 30%, IPA solvent) | 37% |
| Initiator | Irgacure 184 | BASF | Initiator | 2% |
| Solvent | PGMA | | Propylene glycol monomethyl ether acetate | 30% |
| | Butyl acetate | | | 5% |
| Total | | | | 100% |
| Leveling agent | BYK377 | BYK | Polyether-modified polydimethylsiloxane | 0.01 parts by weight per total of 100 parts by weight |

SR610: Polyethylene glycol diacrylate, the average molecular weight of a polyethylene glycol chain: 600

CN968: Hexafunctional aliphatic urethane acrylate having a polyester skeleton

Irgacure 184: 1-Hydroxy-cyclohexyl-phenyl-ketone

<Hardcoat Layer Formation Step>

A roll-like TAC film having a thickness of 80 μm and a length of 3900 m was prepared as a transparent base material 11, the photocurable resin composition shown in Table 1 was applied onto the TAC film with a gravure coater and irradiated with light to be cured, thereby forming a hardcoat layer 12 having a thickness of 5 μm.

Next, an adhesion layer 13, an optical function layer 14 and an antifouling layer were continuously produced on the transparent base material 11 on which the hardcoat layer 12 had been formed in this order by a method to be described below in a roll-to-roll fashion, thereby making an optical laminate (antireflection film) of Example 1.

As a production device, a production device 20 shown in FIG. 4 was used. In addition, the line speed was set to 2 m/min. A first surface treatment step, an adhesion layer formation step, an optical function layer formation step, a second surface treatment step and an antifouling layer formation step were continuously performed while an optical laminate in the middle of production was maintained in a reduced pressure state.

<First Surface Treatment Step>

Next, a glow discharge treatment was performed on the hardcoat layer 12 with a treatment intensity of the glow discharge treatment set to 4000 W·min/m$^2$.

<Adhesion Layer Formation Step and Optical Function Layer Formation Step>

In the adhesion layer formation step, a SiOx layer was formed as the adhesion layer 13 under a condition of a pressure of less than 0.5 Pa. The film was formed using a Si target by introducing oxygen into the chamber. The amount of oxygen was controlled by plasma emission monitoring. The film was formed while a Si element was oxidized, thereby forming an adhesion layer made of SiOx. The thickness of the adhesion layer was set to 5 nm. Next, two high-refractive index layers and two low-refractive index layers were alternately formed. The high-refractive index layers were performed using a Nb target by introducing oxygen into the chamber. The pressure in the chamber was set to 1.0 Pa or less. The film was formed while a Nb element was oxidized, thereby forming high-refractive index layers made of $Nb_2O_5$. The low-refractive index layers were, similar to the adhesion layer, performed using a Si target by introducing oxygen into the chamber. The pressure in the chamber was set to less than 0.5 Pa. The film was formed while a Si element was oxidized, thereby forming low-refractive index layers made of $SiO_2$.

<Second Surface Treatment Step>

A glow discharge treatment was performed on the surface of the optical function layer 14. The integrated output of the glow discharge treatment was 321 W·min/m$^2$.

<Antifouling Layer Formation Step>

Next, the antifouling layer 15 made of an alkoxysilane compound having a perfluoropolyether group, which is an organic compound having fluorine, (KY-1901, manufactured by Shin-Etsu Chemical Co., Ltd.) was formed on the optical function layer 14 by vapor deposition at a pressure in the vapor deposition chamber of 0.01 Pa or less, a vapor deposition temperature of 230° C. and a line speed of 2.0 m/min. The optical film thickness of the obtained antifouling layer 15 is shown in Table 2.

After that, the laminate was wound in a roll shape, thereby obtaining the optical laminate (antireflection film) of Example 1.

TABLE 2

| | | Example 1 | Example 2 | Example 3 | Example 4 | Example 5 | Comparative Example 1 |
|---|---|---|---|---|---|---|---|
| Transparent base material | Kind | TAC film | TAC film | TAC film | TAC film | TAC film | TAC film |
| | Film thickness (μm) | 80 | 80 | 80 | 80 | 80 | 80 |
| Hardcoat | Film thickness (μm) | 5 | 5 | 5 | 5 | 5 | 5 |
| | Filler particle diameter (μm) | 0.05 | 0.05 | 0.05 | 0.05 | 0.05 | 0.05 |
| Degree of vacuum during sputtering | Low-refractive index layer formation pressure | Less than 0.5 Pa | Less than 0.5 Pa | Less than 0.5 Pa | Less than 0.5 Pa | Less than 0.5 Pa | Less than 0.5 Pa |
| | High-refractive index layer formation pressure | Less than 1.0 Pa | Less than 1.0 Pa | Less than 1.0 Pa | Less than 1.0 Pa | Less than 1.0 Pa | Less than 1.0 Pa |
| Discharge treatment | Presence or absence | Present | Present | Present | Present | Present | Absent |
| | Output (kW) | 0.3 | 0.3 | 0.3 | 0.3 | 0.7 | — |
| | Integrated output (W · min/m$^2$) | 321 | 321 | 326 | 321 | 755 | 0 |
| Antifouling layer | | KY1901 | KY1901 | KY1901 | KY1901 | KY1901 | KY1901 |
| Formation method for antifouling layer | | Vapor deposition (continuous) | Vapor deposition (continuous) | Vapor deposition (continuous) | Vapor deposition | Vapor deposition | Coating |
| Film thickness (nm) | | 5.0 | 4.0 | 3.0 | 5.0 | 5.0 | 7.0 |
| Antifouling layer Ra (nm) | | 7.2 | 7.1 | 7 | 7.4 | 7.8 | 2.3 |
| Ra change rate | | 16.1% | 14.5% | 12.9% | 19.4% | 25.8% | — |
| Haze (Hz) | | 0.4 | 0.4 | 0.4 | 0.4 | 0.4 | 0.4 |
| Water vapor transmission rate | | 0.2 | 0.1 | 0.3 | 0.2 | 0.3 | 0.2 |
| Initial state Contact angle (°) | Pure water | 119 | 120 | 120 | 118 | 120 | 114 |
| | Oleic acid | 84 | 81 | 81 | 77 | 77 | 76 |
| | n-Hexadecane | 73 | 72 | 71 | 72 | 73 | 65 |
| | Diiodomethane | 93 | 92 | 88 | 89 | 89 | 88 |
| ESCA | Fluorine amount | 210520 | 212168 | 193200 | 219113 | 201131 | 200218 |
| XRF | Fluorine amount | 0.0473 | 0.0402 | 0.0396 | 0.0588 | 0.0505 | 0.0597 |

| | | Comparative Example 2 | Comparative Example 3 | Comparative Example 4 | Comparative Example 5 |
|---|---|---|---|---|---|
| Transparent base material | Kind | TAC film | TAC film | TAC film | TAC film |
| | Film thickness (μm) | 80 | 80 | 80 | 80 |
| Hardcoat | Film thickness (μm) | 5 | 5 | 5 | 5 |
| | Filler particle diameter (μm) | 0.05 | 0.05 | 0.05 | 0.05 |
| Degree of vacuum during sputtering | Low-refractive index layer formation pressure | Less than 0.5 Pa | Less than 0.5 Pa | 0.5 Pa or more and less than 1 Pa | Less than 0.5 Pa |
| | High-refractive index layer formation pressure | Less than 1.0 Pa | Less than 1.0 Pa | Less than 1.0 Pa | Less than 1.0 Pa |
| Discharge treatment | Presence or absence | Absent | Absent | Present | Present |
| | Output (kW) | — | — | 0.3 | 0.3 |
| | Integrated output (W · min/m$^2$) | 0 | 0 | 326 | 326 |
| Antifouling layer | | KY1901 | KY1901 | KY1901 | KY1901 |
| Formation method for antifouling layer | | Coating | Vapor deposition (continuous) | Vapor deposition (continuous) | Vapor deposition (continuous) |
| Film thickness (nm) | | 10.0 | 5.0 | 5.0 | 2.0 |
| Antifouling layer Ra (nm) | | 4.0 | 6.2 | 8.9 | 6.8 |
| Ra change rate | | — | — | 43.5% | 9.7% |
| Haze (Hz) | | 0.4 | 0.4 | 0.4 | 0.4 |
| Water vapor transmission rate | | 0.3 | 0.3 | 2 | 0.3 |
| Initial state Contact angle (°) | Pure water | 114 | 120 | 117 | 114 |
| | Oleic acid | — | 80 | — | — |
| | n-Hexadecane | 66 | 72 | — | — |
| | Diiodomethane | 92 | 87 | — | — |
| ESCA | Fluorine amount | 219912 | 220770 | — | — |
| XRF | Fluorine amount | 0.0666 | 0.0570 | 0.0565 | 0.0250 |

Example 2

An optical laminate (antireflection film) of Example 2 was obtained in the same manner as in Example 1 except that the optical film thickness of the antifouling layer 15 was controlled to reach 4 nm.

Example 3

An optical laminate (antireflection film) of Example 3 was obtained in the same manner as in Example 1 except that the optical film thickness of the antifouling layer 15 was controlled to reach 3 nm and the integrated output was controlled to reach 326 W·min/$m^2$.

Example 4

An optical function layer formation step was performed in the same manner as in Example 1, then, a TAC film on which a hardcoat layer 12, an adhesion layer 13 and an optical function layer 14 had been formed was wound, removed from the production device and placed still in the atmosphere for 30 days in an environment of a temperature of 25° C. and a humidity of 55%. After that, the TAC film on which the hardcoat layer 12, the adhesion layer 13 and the optical function layer 14 had been formed was installed in the production device and unwound, and the second surface treatment step and the antifouling layer formation step were performed thereon in the same manner as in Example 1, thereby forming an antifouling layer 15 on the optical function layer 14 and winding the laminate in a roll shape. An optical laminate (antireflection film) of Example 4 was fabricated by the above-described steps.

The optical film thickness of the antifouling layer 15 of the optical laminate of Example 4 is shown in Table 2.

Example 5

Example 5 was different from Example 4 in that the conditions for the second surface treatment on the surface of the optical function layer 14 were changed.

The output of the glow discharge treatment was set to 0.7 kW, and the integrated output was set to 755 W·min/$m^2$.

Comparative Examples 1 and 2

Steps up to the optical function layer formation step were performed in the same manner as in Example 1, then, a TAC film on which a hardcoat layer 12, an adhesion layer 13 and an optical function layer 14 had been formed was wound, removed from the production device and installed in a roll-to-roll fashion application device (coater). After that, at the atmospheric pressure, the TAC film on which the hardcoat layer 12, the adhesion layer 13 and the optical function layer 14 had been formed was unwound, and an antifouling agent was applied onto the $SiO_2$ film (low-refractive index layer) of the optical function layer 14 using a gravure coater at a line speed of 20 m/min.

As an antifouling agent, an alkoxysilane compound having a perfluoropolyether group (KY-1901, manufactured by Shin-Etsu Chemical Co., Ltd.) was used after being diluted to a concentration of 0.1 mass % using a fluorine solvent (FLUORINERT FC-3283: manufactured by 3M Japan Limited). The antifouling agent was applied so that the thickness after drying reached a film thickness shown in Table 2.

Comparative Example 3

An optical laminate (antireflection film) of Comparative Example 3 was obtained in the same manner as in Example 1 except that the first surface treatment step (the glow discharge treatment of the surface of the hardcoat layer) and the second surface treatment step (the glow discharge treatment of the surface of the optical function layer) were not performed. The surface roughness Ra of an antifouling layer of Comparative Example 3 was regarded as Ra1 that acted as the calculation criterion for the change rates of surface roughness of the antifouling layers of Examples 1 to 5 and Comparative Examples 4 and 5.

Comparative Example 4

An optical laminate (antireflection film) of Comparative Example 4 was obtained in the same manner as in Example 1 except that the pressure at the time of forming the low-refractive index layer was set to 0.5 Pa or more and less than 1.0 Pa and the pressure at the time of forming the high-refractive index layer was set to less than 1.0 Pa.

Comparative Example 5

An optical laminate (antireflection film) of Comparative Example 5 was obtained in the same manner as in Example 1 except that the film thickness of the antifouling layer was set to 2.0 nm.

Examples 6 to 8

Examples 6 to 8 are different from Example 1 in that the configuration of the hardcoat was changed. In Examples 6 to 8, the hardcoat layer formation step was not performed, and a film of a commercially available product (manufactured by Dai Nippon Printing Co., Ltd.) having a hardcoat layer was used. The hardcoat layer is a cured product of an acrylic resin composition having a filler with an average particle diameter of 2 μm. The film thickness of the hardcoat layer was 3 μm. The hardcoat layer was laminated on a TAC (transparent base material) having a thickness of 80 In addition, a first surface treatment step, an adhesion layer formation step, an optical function layer formation step, a second surface treatment step and an antifouling layer formation step were performed in order on the hardcoat layer.

In Example 6, the second surface treatment step was performed at an output of 1.0 kW, and the integrated output was set to 1086 W·min/$m^2$. In addition, in Example 6, the film thickness of the antifouling layer was set to 5.0 nm.

Example 7 was different from Example 6 in that the second surface treatment step was performed at an output of 1.5 kW, and the integrated output was set to 1629 W·min/$m^2$.

Example 8 was different from Example 6 in that the film thickness of the antifouling layer was set to 4.0 nm.

Examples 9 to 12

Examples 9 to 12 are different from Example 1 in that the configuration of the hardcoat was changed. In Examples 9 to 12, the hardcoat layer formation step was not performed, and a film of a commercially available product (manufactured by Dai Nippon Printing Co., Ltd.) having a hardcoat layer was used. The hardcoat layer is a cured product of an acrylic resin composition having a filler with an average particle diameter of 2 μm. The film thickness of the hardcoat layer was 5 μm. The hardcoat layer was laminated on a TAC (transparent base material) having a thickness of 60 μm. In addition, a first surface treatment step, an adhesion layer formation step, an optical function layer formation step, a second surface treatment step and an antifouling layer formation step were performed in order on the hardcoat layer.

In Example 9, the second surface treatment step was performed at an output of 1.0 kW, and the integrated output was set to 1086 W·min/m$^2$. In addition, in Example 9, the film thickness of the antifouling layer was set to 5.0 nm.

Example 10 was different from Example 9 in that the second surface treatment step was performed at an output of 1.5 kW, and the integrated output was set to 1629 W·min/m$^2$.

Example 11 was different from Example 9 in that the second surface treatment step was performed at an output of 0.5 kW, and the integrated output was set to 543 W·min/m$^2$.

Example 12 was different from Example 9 in that the film thickness of the antifouling layer was set to 4.0 nm.

Comparative Example 6

An optical laminate (antireflection film) of Comparative Example 6 was obtained in the same manner as in Example 6 except that the first surface treatment step (the glow discharge treatment of the surface of the hardcoat layer) and the second surface treatment step (the glow discharge treatment of the surface of the optical function layer) were not performed. The average length of elements RSm of an antifouling layer of Comparative Example 6 was regarded as the calculation criterion RSm1 for the change rates of the average length of elements RSm of antifouling layers of Examples 6 to 8.

Comparative Example 7

Steps up to the optical function layer formation step were performed in the same manner as in Example 7, then, a TAC film on which a hardcoat layer 12, an adhesion layer 13 and an optical function layer 14 had been formed was wound, removed from the production device and installed in a roll-to-roll fashion application device (coater). After that, at the atmospheric pressure, the TAC film on which the hardcoat layer 12, the adhesion layer 13 and the optical function layer 14 had been formed was unwound, and an antifouling agent was applied onto the $SiO_2$ film (low-refractive index layer) of the optical function layer 14 using a gravure coater at a line speed of 20 m/min.

As an antifouling agent, an alkoxysilane compound having a perfluoropolyether group (KY-1901, manufactured by Shin-Etsu Chemical Co., Ltd.) was used after being diluted to a concentration of 0.1 mass % using a fluorine solvent (FLUORINERT FC-3283: manufactured by 3M Japan Limited). The antifouling agent was applied so that the thickness after drying reached a film thickness shown in Table 3A and Table 3B.

Comparative Example 8

An optical laminate (antireflection film) of Comparative Example 8 was obtained in the same manner as in Example 9 except that the first surface treatment step (the glow discharge treatment of the surface of the hardcoat layer) and the second surface treatment step (the glow discharge treatment of the surface of the optical function layer) were not performed. The average length of elements RSm of an antifouling layer of Comparative Example 8 was regarded as the calculation criterion RSm1 for the change rates of the average length of elements RSm of antifouling layers of Examples 9 to 12.

Comparative Example 9

Steps up to the optical function layer formation step were performed in the same manner as in Example 9, then, a TAC film on which a hardcoat layer 12, an adhesion layer 13 and an optical function layer 14 had been formed was wound, removed from the production device and installed in a roll-to-roll fashion application device (coater). After that, at the atmospheric pressure, the TAC film on which the hardcoat layer 12, the adhesion layer 13 and the optical function layer 14 had been formed was unwound, and an antifouling agent was applied onto the $SiO_2$ film (low-refractive index layer) of the optical function layer 14 using a gravure coater at a line speed of 20 m/min.

As the antifouling agent, an alkoxysilane compound having a perfluoropolyether group (KY-1901, manufactured by Shin-Etsu Chemical Co., Ltd.) was used after being diluted to a concentration of 0.1 mass % using a fluorine solvent (FLUORINERT FC-3283: manufactured by 3M Japan Limited). The antifouling agent was applied so that the thickness after drying reached a film thickness shown in Table 3A and Table 3B.

Comparative Example 10

An optical laminate (antireflection film) of Comparative Example 10 was obtained in the same manner as in Example 6 except that the pressure at the time of forming the low-refractive index layer was set to 0.5 Pa or more and less than 1.0 Pa and the pressure at the time of forming the high-refractive index layer was set to less than 1.0 Pa.

Comparative Example 11

An optical laminate (antireflection film) of Comparative Example 11 was obtained in the same manner as in Example 1 except that the film thickness of the antifouling layer was set to 2.0 nm.

TABLE 3A

| | | Example 6 | Example 7 | Example 8 | Example 9 | Example 10 | Example 11 | Example 12 |
|---|---|---|---|---|---|---|---|---|
| Transparent base material | Kind | TAC film | TAC film | TAC film | TAC film | TAC film | TAC film | TAC film |
| | Film thickness (μm) | 80 | 80 | 80 | 60 | 60 | 60 | 60 |
| Hardcoat | Film thickness (μm) | 3 | 3 | 3 | 5 | 5 | 5 | 5 |
| | Filler particle diameter (μm) | 2 | 2 | 2 | 2 | 2 | 2 | 2 |
| Degree of vacuum | Low-refractive index | Less than | Less than | Less than | Less than | Less than | Less than | Less than |

TABLE 3A-continued

| | | | Example 6 | Example 7 | Example 8 | Example 9 | Example 10 | Example 11 | Example 12 |
|---|---|---|---|---|---|---|---|---|---|
| during sputtering | | layer formation pressure | 0.5 Pa | 0.5 Pa | 0.5 Pa | 0.5 Pa | 0.5 Pa | 0.5 Pa | 0.5 Pa |
| | | High-refractive index layer formation pressure | Less than 1.0 Pa | Less than 1.0 Pa | Less than 1.0 Pa | Less than 1.0 Pa | Less than 1.0 Pa | Less than 1.0 Pa | Less than 1.0 Pa |
| Discharge treatment | | Presence or absence | Present | Present | Present | Present | Present | Present | Present |
| | | Output (kW) | 1.0 | 1.5 | 1.0 | 1.0 | 1.5 | 0.5 | 1.0 |
| | | Integrated output ($W \cdot min/m^2$) | 1086 | 1629 | 1086 | 1086 | 1629 | 543 | 1086 |
| Antifouling layer | | | KY1901 | KY1901 | KY1901 | KY1901 | KY1901 | KY1901 | KY1901 |
| Formation method for antifouling layer | | | Vapor deposition (continuous) | Vapor deposition (continuous) | Vapor deposition (continuous) | Vapor deposition (continuous) | Vapor deposition (continuous) | Vapor deposition (continuous) | Vapor deposition (continuous) |
| Film thickness (nm) | | | 5.0 | 5.0 | 4.0 | 5.0 | 5.0 | 5.0 | 4.0 |
| Haze (Hz) | | | 4% | 4% | 4% | 10% | 10% | 10% | 10% |
| Water vapor transmission rate | | | 0.3 | 0.2 | 0.3 | 0.1 | 0.2 | 0.3 | 0.1 |
| Average length of elements RSm (nm) | | | 59.2 | 76.8 | 59.2 | 60.9 | 86.2 | 62.1 | 60.9 |
| RSm change rate | | | 11.5% | 44.6% | 11.5% | 14.0% | 61.4% | 16.3% | 14.0% |
| Initial state | Contact angle (°) | Pure water | 116.7 | 117.7 | 117.0 | 117.0 | 116.3 | 116.9 | 117.3 |
| | | Oleic acid | 77 | 78 | 77 | 80 | 80 | 79 | 78 |
| | | n-Hexadecane | 68 | 71 | 71 | 72 | 71 | 72 | 70 |
| | | Diiodomethane | 91 | 92 | 90 | 89 | 91 | 91 | 90 |
| | XRF | Fluorine amount | 0.465 | 0.0480 | 0.0410 | 0.0506 | 0.0478 | 0.0522 | 0.0456 |

TABLE 3B

| | | | Comparative Example 6 | Comparative Example 7 | Comparative Example 8 | Comparative Example 9 | Comparative Example 10 | Comparative Example 11 |
|---|---|---|---|---|---|---|---|---|
| Transparent base material | | Kind | TAC film | TAC film | TAC film | TAC film | TAC film | TAC film |
| | | Film thickness (μm) | 80 | 80 | 60 | 60 | 80 | 80 |
| Hardcoat | | Film thickness (μm) | 3 | 3 | 5 | 5 | 3 | 3 |
| | | Filler particle diameter (μm) | 2 | 2 | 2 | 2 | 2 | 2 |
| Degree of vacuum during sputtering | | Low-refractive index layer formation pressure | Less than 0.5 Pa | Less than 0.5 Pa | Less than 0.5 Pa | Less than 0.5 Pa | 0.5 Pa or more and less than 1 Pa | Less than 0.5 Pa |
| | | High-refractive index layer formation pressure | Less than 1.0 Pa | Less than 1.0 Pa | Less than 1.0 Pa | Less than 1.0 Pa | Less than 1.0 Pa | Less than 1.0 Pa |
| Discharge treatment | | Presence or absence | Absent | Absent | Absent | Absent | Present | Present |
| | | Output (kW) | — | — | — | — | 1.0 | 1.0 |
| | | Integrated output ($W \cdot min/m^2$) | 0 | 0 | 0 | 0 | 1086 | 1086 |
| Antifouling layer | | | KY1901 | KY1901 | KY1901 | KY1901 | KY1901 | KY1901 |
| Formation method for antifouling layer | | | Vapor deposition (continuous) | Coating | Vapor deposition (continuous) | Coating | Vapor deposition (continuous) | Vapor deposition (continuous) |
| Film thickness (nm) | | | 4.0 | 5.0 | 4.0 | 5.0 | 5.0 | 2.0 |
| Haze (Hz) | | | 10% | 4% | 4% | 10% | 4% | 4% |
| Water vapor transmission rate | | | 0.2 | 0.3 | 0.2 | 0.2 | 2 | 0.2 |
| Average length of elements RSm (nm) | | | 53.1 | 53.1 | 53.4 | 53.4 | — | — |
| RSm change rate | | | — | — | — | — | — | — |
| Initial state | Contact angle (°) | Pure water | 116.3 | 115.4 | 116.3 | 114 | 114 | 114 |
| | | Oleic acid | 77 | 79 | 77 | 77 | — | — |
| | | n-Hexadecane | 71 | 72 | 71 | 69 | — | — |
| | | Diiodomethane | 90 | 92 | 89 | 90 | — | — |
| | XRI | Fluorine amount | 0.0419 | 0.0531 | 0.0438 | 0.0593 | 0.0512 | 0.0231 |

(Surface Roughness Ra of Antifouling Layer)

The surface roughness Ra in the obtained optical laminates (antireflection films) of Examples 1 to 5 and Comparative Examples 1 to 5 were measured by the following method.

A 50 mm×50 mm measurement sample was cut out from a position that was the center in the length direction and the center in the width direction of each roll around which the optical laminate was wound. The surface of the sample was observed using an atomic force microscope (AFM) (trade name: SPA400, NanoNavill manufactured by Hitachi, Ltd.), and the surface roughness Ra in an area range of 1 $\mu m^2$ was measured. The measurement was performed at three places on the sample, and the average value was regarded as the measurement value.

In addition, the change rates of surface roughness represented by the following formula (1) are shown in Table 2.

$$\text{Change rate (\%) of surface roughness} = ((Ra2/Ra1) - 1) \times 100(\%) \qquad \text{Formula (1)}$$

(In the formula (1), Rat indicates the surface roughness (Ra) of the antifouling layer in the optical laminate in which the antifouling layer has been formed without performing a surface treatment, and Ra2 indicates the surface roughness (Ra) of the antifouling layer in the optical laminate in which the surface has been treated and then the antifouling layer has been formed.)

(Average Length of Elements RSm of Antifouling Layer)

The average lengths of an element RSm in the obtained optical laminates (antireflection films) of Examples 6 to 12 and Comparative Examples 6 to 12 were measured by the following method.

A 50 mm×50 mm measurement sample was cut out from a position that was the center in the length direction and the center in the width direction of each roll around which the optical laminate was wound. The surface of the sample was measured using the atomic force microscope (AFM) (trade name: SPA400, NanoNaviII: manufactured by Hitachi, Ltd.), straight lines were selected at three places on an upper surface view that was not affected by the filler for developing an antiglare function, which was contained in the hardcoat layer, and the average length of elements RSm was calculated from actual unevenness in the straight lines at the three places.

In addition, in these examples and comparative examples, the change rates of the average length of elements represented by the following formula (2) were measured.

$$\text{Change rate (\%) of average length of elements} = ((RSm2/RSm1)-1)\times 100(\%) \qquad \text{Formula (2)}$$

(In the formula (2), RSm1 indicates the average length of elements (RSm) of the antifouling layer in the optical laminate in which the antifouling layer has been formed without performing a surface treatment, and RSm2 indicates the average length of elements (RSm) of the antifouling layer in the optical laminate in which the surface has been treated and then the antifouling layer has been formed.)

The surface roughness Ra and average length of elements RSm of the antifouling layer are affected by the surface roughness Ra and average length of elements RSm of the optical function layer that is below the antifouling layer. Particularly, in an antifouling layer formed by vapor deposition, unlike an antifouling layer formed by the coating method, there are no cavities attributed to a solvent that is contained in paint, and the antifouling layer is formed to have a high density, and thus the influence of the surface roughness Ra and average length of elements RSm of an optical function layer that is below the antifouling layer is large compared with the influence on the antifouling layer formed by the coating method. When a glow discharge treatment is performed on the surface of the optical function layer, it is considered that the antifouling layer is affected by the surface roughness Ra and average length of elements RSm of the optical function layer and the surface state of the antifouling layer changes. The difference in surface roughness between Example 1 and Example 4 is considered to result from the pressure that was not reduced until the second surface treatment. In addition, the difference in surface roughness between Example 1 and Comparative Example 3 is attributed to the presence or absence of the glow discharge treatment.

(Water Vapor Transmission Rate)

Water vapor transmission rates in the examples and the comparative examples were measured under the following conditions.

The optical laminate cut out to 100 mm×100 mm was set in a water vapor transmission rate measuring instrument (trade name: PERMATRAN-W3/34; manufactured by AMETEK MOCON), the water vapor transmission rate was continuously measured by an infrared sensor method based on JIS 7129 (ISO 15106-2) under conditions of 40° C. and a relative humidity of 90%, and a measurement value after 24 hours was regarded as the water vapor transmission rate.

In addition, for each of the optical laminates (antireflection films) of Examples 1 to 12 and Comparative Examples 1 to 12, the characteristics were investigated. The results are shown in the following tables. Test pieces used in the characteristic measurements of Examples 1 to 12 and Comparative Examples 1 to 12 were each cut out from the vicinity of substantially the center in the length direction of the roll around which the optical laminate was wound. In Comparative Examples 5 and 11, the initial amount of fluorine was small, and a test regarding durability was not performed.

TABLE 4

| | | | Example 1 | Example 2 | Example 3 | Example 4 | Example 5 | Comparative Example 1 |
|---|---|---|---|---|---|---|---|---|
| Waste cloth abrasion test | Pure water contact angle (°) | 0 reciprocations | 119 | 120 | 120 | 118 | 120 | 114 |
| | | 500 reciprocations | 119 | 120 | 117 | 118 | 121 | 114 |
| | | 1000 reciprocations | 119 | 116 | 114 | 118 | 120 | 112 |
| | | 2000 reciprocations | 119 | 114 | 111 | 116 | 119 | 101 |
| | | 4000 reciprocations | 118 | 111 | 108 | 115 | 119 | 94 |
| | | Contact angle difference | 1 | 9 | 12 | 3 | 1 | 20 |
| | ESCA fluorine amount | Before test | 210520 | 212168 | 193200 | 295495 | 254545 | 200218 |
| | | After test | 209810 | 192600 | 186486 | 200770 | 208930 | 160583 |
| | | Survival rate | 99.7% | 90.8% | 96.5% | 67.9% | 82.1% | 80.2% |
| Alkali resistance test | Hue change | ΔE value (SCI) | 2.0 | 2.3 | 3.6 | 7.7 | 1.8 | 36.7 |
| | XRF fluorine amount | Before test | 0.0473 | 0.0402 | 0.0396 | 0.0588 | 0.0505 | 0.0579 |
| | | After test | 0.043 | 0.0382 | 0.0377 | 0.0508 | 0.0469 | 0.0100 |
| | | Survival rate | 90.9% | 95.0% | 95.2% | 86.4% | 92.9% | 17.3% |

| | | | Comparative Example 2 | Comparative Example 3 | Comparative Example 4 | Comparative Example 5 |
|---|---|---|---|---|---|---|
| Waste cloth | Pure water | 0 reciprocations | 114 | 120 | — | — |
| | | 500 | 114 | 120 | — | — |

TABLE 4-continued

| | | | | | | |
|---|---|---|---|---|---|---|
| abrasion test | contact angle (°) | reciprocations 1000 reciprocations | 114 | 113 | — | — |
| | | 2000 reciprocations | 111 | 104 | — | — |
| | | 4000 reciprocations | 97 | 98 | — | — |
| | | Contact angle difference | 17 | 22 | — | — |
| | ESCA fluorine amount | Before test | 219912 | 220770 | — | — |
| | | After test | 171766 | 154836 | — | — |
| | | Survival rate | 78.1% | 70.1% | — | — |
| Alkali resistance test | Hue change | ΔE value (SCI) | 19.0 | 29.5 | — | 24.4 |
| | XRF fluorine amount | Before test | 0.0666 | 0.0570 | 0.0565 | 0.025 |
| | | After test | 0.0435 | 0.0108 | 0.028 | 0.0145 |
| | | Survival rate | 65.3% | 18.9% | 49.6% | 58.10% |

TABLE 5

| | | | Example 6 | Example 7 | Example 8 | Example 9 | Example 10 | Example 11 | Example 12 |
|---|---|---|---|---|---|---|---|---|---|
| Waste cloth abrasion test | Pure water contact angle (°) | 0 reciprocations | 118 | 117 | 118 | 115 | 121 | 117 | 117 |
| | | 500 reciprocations | 118 | 118 | 116 | 121 | 121 | 119 | 119 |
| | | 1000 reciprocations | 113 | 114 | 114 | 121 | 121 | 119 | 118 |
| | | 2000 reciprocations | 113 | 114 | 115 | 119 | 121 | 116 | 114 |
| | | 4000 reciprocations | 110 | 114 | 114 | 115 | 121 | 115 | 111 |
| | | Contact angle difference | 8 | 3 | 4 | 0 | 0 | 2 | 6 |
| | ESCA fluorine amount | Before test | 232500 | 240000 | 205000 | 253000 | 239000 | 261000 | 228000 |
| | | After test | 191382 | 198522 | 199338 | 200562 | 213006 | 205050 | 192810 |
| | | Survival rate | 82.31% | 82.72% | 97.24% | 79.27% | 89.12% | 78.56% | 84.57% |
| Alkali resistance test | Hue change | ΔE value (SCI) | 3.3 | 1.2 | 3.0 | 3.1 | 2.0 | 2.3 | 2.7 |
| | XRF fluorine amount | Before test | 0.0456 | 0.0480 | 0.0410 | 0.0506 | 0.0478 | 0.0522 | 0.0456 |
| | | After test | 0.043262 | 0.047056 | 0.038438 | 0.047317 | 0.0460 | 0.0498 | 0.043076 |
| | | Survival rate | 93.0% | 98.0% | 93.8% | 93.5% | 96.1% | 95.4% | 94.5% |

| | | | Comparative Example 6 | Comparative Example 7 | Comparative Example 8 | Comparative Example 9 | Comparative Example 10 | Comparative Example 11 |
|---|---|---|---|---|---|---|---|---|
| Waste cloth abrasion test | Pure water contact angle (°) | 0 reciprocations | 118 | 117 | 117 | 118 | — | — |
| | | 500 reciprocations | 115 | 115 | 119 | 117 | — | — |
| | | 1000 reciprocations | 114 | 115 | 117 | 116 | — | — |
| | | 2000 reciprocations | 113 | 114 | 114 | 115 | — | — |
| | | 4000 reciprocations | 110 | 112 | 114 | 115 | — | — |
| | | Contact angle difference | 8 | 5 | 3 | 3 | — | — |
| | ESCA fluorine amount | Before test | 209500 | 265500 | 219000 | 296500 | — | — |
| | | After test | 191178 | 194850 | 197706 | 201174 | — | — |
| | | Survival rate | 91.25% | 73.39% | 90.28% | 67.85% | — | — |
| Alkali resistance test | Hue change | ΔE value (SCI) | 20.8 | 25.1 | 34.8 | 23.4 | — | — |
| | XRF fluorine amount | Before test | 0.0419 | 0.0531 | 0.0438 | 0.0593 | 0.0512 | 0.0231 |
| | | After test | 0.021531 | 0.02189 | 0.007913 | 0.026831 | 0.0277 | 0.0105 |
| | | Survival rate | 51.4% | 41.2% | 18.1% | 45.2% | 54.1% | 45.5% |

55

TABLE 6

| | | | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|---|
| Steel | Pure | 0 recipro- | 120 | 118 | 121 | 115 | 117 | 113 | 114 | 117 | — | — |

TABLE 6-continued

| | | | Example 1 | Example 2 | Example 3 | Example 4 | Example 5 | Comparative Example 1 | Comparative Example 2 | Comparative Example 3 | Comparative Example 4 | Comparative Example 5 |
|---|---|---|---|---|---|---|---|---|---|---|---|---|
| wool abrasion test | water contact angle (°) | cations | | | | | | | | | | |
| | | 250 reciprocations | 115 | — | — | 110 | 110 | 103 | 87 | 105 | — | — |
| | | 500 reciprocations | 112 | 109 | 109 | 110 | 109 | 98 | 87 | 99 | — | — |
| | | Contact angle difference (between 0) rotations and 500 rotations) | 8 | 9 | 12 | 5 | 8 | 14 | 27 | 18 | — | — |
| | Hue change | ΔE value (SCI) | 2.4 | 1.8 | 1.4 | 2.7 | 2.5 | 3.5 | 3.8 | 3.9 | — | — |
| | | ΔE value (SCE) | 0.5 | 0.2 | 0.2 | 0.2 | 0.2 | 0.1 | 2.4 | 0.6 | — | — |
| Pen sliding test | Presence or absence of scratch | | Absent | Absent | Absent | Present | Present | Present | Present | Present | — | — |

TABLE 7

| | | | Example 6 | Example 7 | Example 8 | Example 9 | Example 10 | Example 11 | Example 12 | Comparative Example 6 |
|---|---|---|---|---|---|---|---|---|---|---|
| Steel wool abrasion test | Pure water contact angle (°) | 0 reciprocations | 117.2 | 116.5 | 116.5 | 117.0 | 116.3 | 116.9 | 117.3 | 115.5 |
| | | 100 reciprocations | 96.1 | 96.3 | 94.2 | 107.0 | 108.2 | 102.6 | 97.8 | 92.1 |
| | | Contact angle difference (between 0 rotations and 100 rotations) | 21.1 | 20.2 | 22.3 | 10.0 | 8.1 | 14.3 | 19.5 | 23.4 |
| | Hue change | ΔE value (SCI) | 1.8 | 1.66 | 1.12 | 0.51 | 1.52 | 1.11 | 1.32 | 1.81 |
| Pen sliding test | Presence or absence of scratch | | Absent | Absent | Absent | Absent | Absent | Absent | Absent | Present |

| | | | Comparative Example 7 | Comparative Example 8 | Comparative Example 9 | Comparative Example 10 | Comparative Example 11 |
|---|---|---|---|---|---|---|---|
| Steel wool abrasion test | Pure water contact angle (°) | 0 reciprocations | 115.4 | 116.3 | 114.4 | — | — |
| | | 100 reciprocations | 100.0 | 98.3 | 97.0 | — | — |
| | | Contact angle difference (between 0 rotations and 100 rotations) | 15.4 | 18.0 | 17.4 | — | — |
| | Hue change | ΔE value (SCI) | 1.78 | 0.97 | 1.16 | — | — |
| Pen sliding test | Presence or absence of scratch | | Present | Present | Present | | — |

TABLE 8

| | | | Example 1 | Example 4 | Comparative Example 1 | Comparative Example 2 | Comparative Example 3 |
|---|---|---|---|---|---|---|---|
| Ultrasonic washing | XRF fluorine amount | Before washing | 0.0474 | 0.0591 | 0.0579 | 0.0666 | 0.0570 |
| | | After washing | 0.0406 | 0.0467 | 0.0363 | 0.0265 | 0.0347 |
| | | Survival rate | 85.7% | 79.0% | 62.7% | 39.8% | 60.9% |

TABLE 9A

| | | | Example 6 | Example 7 | Example 8 | Example 9 | Example 10 | Example 11 | Example 12 |
|---|---|---|---|---|---|---|---|---|---|
| Ultrasonic washing | XRF fluorine amount | Before washing | 0.0465 | 0.0480 | 0.0410 | 0.0506 | 0.0478 | 0.0522 | 0.0456 |
| | | After washing | 0.0394 | 0.0371 | 0.0361 | 0.0432 | 0.0415 | 0.0405 | 0.0389 |
| | | Survival rate | 84.7% | 77.3% | 88.0% | 85.4% | 86.8% | 77.6% | 85.3% |

TABLE 9B

| | | | Comparative Example 6 | Comparative Example 7 | Comparative Example 8 | Comparative Example 9 | Comparative Example 10 | Comparative Example 11 |
|---|---|---|---|---|---|---|---|---|
| Ultrasonic washing | XRF fluorine amount | Before washing | 0.0419 | 0.0531 | 0.0438 | 0.0593 | — | — |
| | | After washing | 0.0344 | 0.0337 | 0.0376 | 0.0339 | — | — |
| | | Survival rate | 82.1% | 63.5% | 85.8% | 57.2% | — | — |

(1) Contact Angle (Antifouling Property)

(1-1) Test for Measuring Contact Angle with Respect to Pure Water

The contact angle with respect to pure water was measured by an ellipse fitting method under the following conditions using a fully automatic contact angle meter DM-700 (manufactured by Kyowa Interface Science Co., Ltd.). Distilled water was put into a glass syringe, a stainless steel needle was mounted on the tip, and pure water was added dropwise to the optical laminate (test piece).

Amount of pure water added dropwise: 2.0 μL

Measurement temperature: 25° C.

The contact angle after four seconds from the dropwise addition of pure water was measured at six arbitrary places on the surface of the test piece, and the average value thereof was regarded as the pure water contact angle.

(1-2) Test for Measuring Contact Angles with Respect to Oleic Acid, n-Hexadecane and Diiodomethane (Reagents)

The contact angles with respect to oleic acid, n-hexadecane and diiodomethane (reagents) were measured by the ellipse fitting method under the following conditions using the fully automatic contact angle meter DM-700 (manufactured by Kyowa Interface Science Co., Ltd.). Each of the above-described reagents was put into a glass syringe, a stainless steel needle was mounted on the tip, and each reagent was added dropwise to the optical laminate (test piece).

Amount of each reagent added dropwise: 2.0 μL

Measurement temperature: 25° C.

The contact angle after four seconds from the dropwise addition of each reagent was measured at 10 arbitrary places on the surface of the test piece, and the average value thereof was regarded as the contact angle of each of oleic acid, n-hexadecane and diiodomethane.

(2) Test for Measuring Amount of Fluorine

The amount of fluorine (cps: counts per second) of the optical laminate (test piece) was measured (amount of fluorine before washing (amount of fluorine in an initial state)).

In the measurement of the amount of fluorine, an electron spectroscopy for chemical analysis (ESCA) (PHI5000 VersaProbeIII, manufactured by ULVAC-PHI Inc.) and X-ray fluorescence analysis (XRF) (EDX-8000, manufactured by Shimadzu Corporation) were used. The fluorine value (cps) obtained by the electron spectroscopy for chemical analysis and the X-ray fluorescence analysis is the average value calculated from results obtained by measurement with n=3 in the initial state and n=15 after an alkali resistance test.

(3) Alkali Resistance Test

The optical characteristics of the optical laminate (test piece) were measured (sample before treatment).

Next, a sodium hydroxide aqueous solution (reagent) having a concentration of 0.1 mol/L was prepared.

In addition, a cylindrical member having an inner diameter of 38 mm was attached to the optical laminate (test piece), the reagent was added dropwise thereinto, and the opening on the upper surface was closed with a glass plate as a lid. In addition, the liquid temperature was held at 55° C., the reagent was placed still for four hours, and then each test piece was washed with distilled water, thereby obtaining a sample after treatment.

(3-1) Measurement of Optical Characteristics (Hue Change)

The rear surfaces of the above-described sample before treatment and sample after treatment were attached to black acryl plates with transparent tape, and rear surface reflection was eliminated. In addition, the optical characteristics were measured.

In the optical measurement, a portable sphere spectrophotometer (SP-64: manufactured by X-Rite, Incorporate) was used. Regarding the setting, a D65 light source was used and 10° was set, and the ΔE values, which are the change amounts of the L*a*b* (based on CIE 1976) value represented by the formula (2) by SCI (specular component include, a measurement method of reflected color in consideration of specular light), of the sample before treatment and the sample after treatment were calculated. As L0*, a0* and b0* in the formula (2), the values of the sample before treatment were assigned, and as L1*, a1* and b1*, the values of the sample after treatment that had been brought into contact with the sodium hydroxide aqueous solution were assigned.

(3-2) Test for Measuring Fluorine Residual Amount by Alkali Solution

In the same manner as in the above-described test (2), the amount of fluorine (cps) of the sample after a treatment with an alkali solution was measured using ESCA or XRF, and the survival rate (%) of fluorine in the sample after treatment was calculated.

(4) Abrasion Test Using Steel Wool

A friction body was horizontally and reciprocally moved along the surface of the optical laminate (test piece) using a friction tester type I based on JIS L 0849, thereby obtaining a test piece.

As the friction body, a steel wool (No. #0000 manufactured by Bonstar) was used. Regarding the test setting, the load was set to 1000 g/cm$^2$, the stroke was set to 75 mm, and the speed was set to 7 mm/s. The numbers of times of horizontal reciprocation of the friction body are shown in Tables 6 and 7.

(4-1) Contact Angle

The contact angle of the test piece after the friction was measured in the same manner as in the above-described test (1-1), and the contact angle difference of the test piece between before the friction and after the friction by 500 times of horizontal and reciprocal movement was obtained. The test was performed within 30 minutes from the friction.

(4-2) Measurement of Optical Characteristics (Hue Change)

The ΔE values, which are the change amounts of the ΔL*a*b* value represented by SCI, of the test piece before the friction and after the friction by 500 times (100 times in Examples 6 to 12 and Comparative Examples 4 to 7) of horizontal and reciprocal movement were calculated in the same manner as in the above-described test (3-1).

In addition, the ΔE values, which are the change amounts of the L*a*b* value represented by the formula (3) by SCE (specular component exclude, a measurement method of reflected color not in consideration of specular light), of the test piece before the friction and after the friction by 500 times (100 times in Examples 6 to 12 and Comparative Examples 4 to 7) of horizontal and reciprocal movement were calculated in the same manner as in the above-described test (3-1).

(5) Abrasion Test Using Waste Cloth (Nonwoven Wiper)

An abrasion test was performed in the same manner as the abrasion test using the steel wool except that a waste cloth (nonwoven wiper) (BEMCOT LINT FREE CT-8, manufactured by Asahi Kasei Corporation) was used as the friction body. Regarding the test setting, the load was set to 250 g/cm$^2$, the stroke was set to 25 mm, and the speed was set to 50 mm/s. The numbers of times of the horizontal and reciprocal movement of the friction body are shown in Tables 4 and 5.

(5-1) Contact Angle

The contact angle of the test piece after the friction was measured in the same manner as in the above-described test (1-1), and the contact angle difference of the test piece between before the friction and after the friction by 4000 times of horizontal and reciprocal movement was obtained. The test was performed within 30 minutes from the friction.

(5-2) Test for Measuring Fluorine Residual Amount

In the same manner as in the above-described test (2), the amount of fluorine (cps) of the sample after treatment on which a waste cloth had been horizontally and reciprocally moved 4000 times using ESCA was measured, and the survival rate (%) of fluorine in the sample after treatment was calculated.

(6) Ultrasonic Washing Test

A fluorine-based solvent (FLUORINERT FC-3283: manufactured by 3M Japan Limited) was put into a container, the optical laminate (test piece) was immersed therein, and ultrasonic waves were applied thereto for 10 minutes using an ultrasonic washer (USK-5R, manufactured by AS ONE Corporation) at 40 KHz and 240 W. After that, the test piece was washed away using the fluorine-based solvent.

In the same manner as in the above-described test (2), the amount of fluorine (cps) of the sample after the ultrasonic washing was measured using XRF, and the survival rate (%) of fluorine in the sample after the washing was calculated.

(7) Pen Sliding Test

A nip for a stylus pen (extra lead for Bamboo Sketch/Bamboo Tip (medium type) manufactured by WACOM Co., Ltd.) was used as a friction body, and the presence or absence of scratch after the nip was reciprocally moved 20000 times under a load of 250 g was checked.

[Superiority of Antifouling Layer Formed by Vapor Deposition to Antifouling Layer Formed by Coating]

Compared with Comparative Examples 1 and 2, in the optical laminates of Examples 1 to 4, the contact angle differences in the abrasion tests using the waste cloth (nonwoven wiper) were small. Compared with Comparative Examples 1 and 2, in the optical laminate of Example 1, the residual rate of fluorine in the abrasion test using the waste cloth (nonwoven wiper) was high.

Compared with Comparative Examples 1 and 2, in the optical laminates of Examples 1 to 4, the hue changes in the alkali resistance tests were small, and the residual rates of fluorine were high.

According to the results shown in Table 2, in the measurement of the contact angle where the antifouling property was exhibited, superiority of the antifouling layer formed by vapor deposition (Example 1) to the antifouling layer formed by coating (Comparative Example 2) was confirmed with respect to oleic acid, n-hexadecane and diiodomethane.

In addition, it was confirmed that the changes in the optical characteristics could be suppressed more in Example 1 than in Comparative Example 2 even after the alkali solution or physical friction.

In the optical laminates of Examples 1 to 4, in the waste cloth abrasion tests, the contact angle differences were 15° or less, which means that the contact angle changed to a small extent, and the initial characteristics could be maintained, which were favorable. In addition, in the optical laminates of Examples 1 to 4, the hue changes ΔE in the alkali resistance tests were as small as 10 or less, which was favorable. In the optical laminate of Example 1, in the steel wool abrasion test, the contact angle difference was 15° or less, which means that the contact angle changed to a small extent, and the initial characteristics could be maintained, which were favorable.

In addition, in the ultrasonic washing tests, the residual rates of fluorine were as high as 70% or more in both of Examples 1 and 4, but the residual rates of fluorine were as low as 62.7% and 39.8% in Comparative Examples 1 and 2.

[Effect of Glow Discharge Treatment]

In the waste cloth scratch resistance tests, in all of the optical laminates of Examples 1 to 4, the contact angle differences were 12° or less, which means that the contact angles changed to a small extent, and the initial characteristics could be maintained, which were favorable; however, in Comparative Example 3, the contact angle difference was 22°, which means that the contact angle changed to a large extent.

In addition, in the alkali resistance tests, in all of the optical laminates of Examples 1 to 4, the hue changes ΔE (SCI) were as small as less than 10, and the residual rates of fluorine were also as high as 85% or more; however, in Comparative Example 3, the hue change ΔE (SCI) was as large as 29.5, and the residual rate of fluorine was also as low as 18.9%.

In the steel wool scratch resistance tests, in all of the optical laminates of Examples 1 to 3, the contact angle differences were 12° or less, which means that the contact angles changed to a small extent, the hue changes ΔE (SCI) were also as small as 2.4 or less, and the initial characteristics could be maintained, which were favorable; however, in Comparative Example 3, the contact angle difference was 18°, which means that the contact angle changed to a large extent, and the hue change ΔE (SCI) was as large as 3.9.

In the ultrasonic washing tests, the residual rates of fluorine were as high as 70% or more in both of Examples 1 and 4, but the residual rate of fluorine was as low as 60.9% in Comparative Example 3.

The effect of the above-described glow discharge treatment, that is, improvement in the wear resistance and the alkali resistance results from the adhesion between the optical function layer and the antifouling layer improved by the fact that the surface of the optical function layer 14 was roughened to appropriate roughness and a substance having a weak bonding force present on the surface was removed. The hue change significantly suppressed in the alkali resistance test is assumed to result from the prevention of the intrusion of an alkali component into the $SiO_2$ layer on the uppermost surface of the optical function layer, which is assumed to be because molecules configuring the antifouling layer chemically bond to the optical function layer at a high density. Furthermore, additional consideration shows that there is also a possibility that the surface roughness Ra and change rates RSm of surface roughness of the antifouling layers in Examples 1 to 4 may be suitable for increasing the density of the chemical bonds of the molecules configuring the antifouling layer.

[Effect of Film Formation Conditions of Optical Function Layer]

Compared with Example 1, in Comparative Example 4, the water vapor transmission rate was high, and the survival rate of fluorine after the alkali resistance test was low. In Comparative Example 10 as well, there was the same tendency compared with Example 6.

That is, it is considered that, when the pressure during the formation of the optical function layer is adjusted, the optical function layer itself becomes dense, which makes it difficult to transmit water vapor. In addition, it is considered that the densification of the optical function layer itself makes the durability improve.

As described above, when the pressure during the formation of the optical function layer is adjusted, the surface of the optical function layer is treated, and the antifouling layer is formed by vapor deposition to a predetermined film thickness or more, each layer becomes dense, and adhesion to other layers is enhanced, which makes it possible to obtain an optical laminate exhibiting desired characteristics.

[Superiority of Antifouling Layer Formed by Vapor Deposition to Antifouling Layer Formed by Coating in AG Type]

According to the results shown in Table 5, in a case where the film thickness of the hardcoat layer was 3 μm, compared with Comparative Example 7, in the optical laminates of Examples 6 to 8, the hue changes ΔE (SCI) in the alkali resistance tests were as small as less than 10, and the survival rates of fluorine were also as high as 85% or more. The results were the same in the comparison between Examples 9 to 12 and Comparative Example 9 in a case where the thickness of the hardcoat layer was 5 μm.

In addition, in the pen sliding tests, compared with the antifouling layers formed by coating, the likelihood of being scratched is different, and no scratches are generated in the antifouling layers formed by the vapor deposition method.

[Effect of Glow Discharge Treatment in AG Type]

Regarding the effect of the glow discharge treatment as well, in a case where the thickness of the hardcoat layer was 5 μm, when Examples 9 to 12 are compared with Comparative Example 8, if RSm was 55 nm to 90 nm, the hue changes ΔE (SCI) in the alkali resistance tests were as small as less than 10, and the survival rates of fluorine were also as high as 85% or more, which were favorable. The results were the same in the comparison between Examples 6 to 8 and Comparative Example 6 in a case where the thickness of the hardcoat layer was 3 μm.

[Influence of Film Thickness of Antifouling Layer]

In the optical laminates of Examples 6 to 8, the film thicknesses of the antifouling layers were 2.5 nm or more, compared with Comparative Example 11 where the film thickness of the antifouling layer was 2 nm, the survival rates of fluorine in the alkali resistance tests were high, and the results became favorable.

REFERENCE SIGNS LIST

10, 101, 102 Optical laminate
11 Transparent base material
12 Hardcoat layer
13 Adhesion layer
14 Optical function layer
14*a* High-refractive index layer
14*b* Low-refractive index layer
15 Antifouling layer
20 Production device
1 Sputtering device
2A, 2B Pretreatment device
3 Vapor deposition device
4 Roll unwinding device
5 Roll winding device
20 Production device
21 Vacuum pump
22 Guide roll
23 Unwinding roll
24 Winding roll
25 Film formation roll
26 Can roll
31, 32, 33, 34, 35 Chamber
41 Film formation portion
42 Plasma discharge device
43 Vapor deposition source
53 Heating device

The invention claimed is:

1. An optical laminate comprising:

a plastic film;

an adhesion layer;

an optical function layer; and an antifouling layer laminated in order, wherein:

the antifouling layer is made of a vapor-deposited film obtained by vapor deposition of an antifouling material;

the antifouling material contains a fluorine-based organic compound;

the adhesion layer is made of an oxide of Si;

a film thickness of the antifouling layer is 2.5 nm or more;

a water vapor transmission rate is 1.5 g/($m^2$·1 day) or less;

a hue change ΔE value of reflected color in consideration of specular light (SCI) after contacting a sodium hydroxide aqueous solution having a liquid temperature of 55° C. and a concentration of 0.1 mol/L for four hours is less than 10; and a surface roughness Ra of the antifouling layer is 3 nm or more and 10 nm or less.

2. The optical laminate according to claim 1, wherein:

a change rate of surface roughness represented by the following formula (1) is 5% to 35% or a change rate of an average length of elements represented by the following formula (2) is 7% to 70%;

$$\text{change rate (\%) of surface roughness}=((Ra2/Ra1)-1)\times 100(\%) \quad \text{Formula (1);}$$

(in the formula (1), Ra1 indicates surface roughness (Ra) of the antifouling layer in the optical laminate in which the antifouling layer has been formed without performing a surface treatment on the optical function layer, and Ra2 indicates surface roughness (Ra) of the antifouling layer in the optical laminate in which a surface of the optical function layer has been treated and then the antifouling layer has been formed);

$$\text{change rate (\%) of average length of elements}=((RSm2/RSm1)-1)\times 100(\%) \quad \text{Formula (2);}$$

(in the formula (2), RSm1 indicates the average length of elements (RSm) of the antifouling layer in the optical laminate in which the antifouling layer has been formed without performing a surface treatment on the optical function layer, and RSm2 indicates the average length of elements (RSm) of the antifouling layer in the optical laminate in which the surface of the optical function layer has been treated and then the antifouling layer has been formed); and where, Ra2 is 3 nm or more and 10 nm or less, and Rsm2 is 55 nm or more and 90 nm or less.

3. The optical laminate according to claim 1, wherein haze is 2% or less, and wherein a contact angle difference with respect to water before and after an abrasion test where a waste cloth is reciprocated 4000 times is 12° or less.

4. The optical laminate according to claim 1, wherein haze is 2% or less, and wherein a contact angle difference with respect to water before friction and after the friction for which a steel wool is horizontally and reciprocally moved 500 times using a friction tester in which the steel wool based on JIS L 0849 is used is 12° or less.

5. The optical laminate according to claim 1, wherein haze is 2% or less, and wherein a change amount (ΔE value) of reflected color in consideration of specular light (SCI) before friction and after the friction for which a steel wool is horizontally and reciprocally moved 500 times is 3.0 or less.

6. The optical laminate according to claim 1, wherein haze is 2% or less, and wherein a survival amount of a fluorine atom in the antifouling layer by XRF after irradiating with ultrasonic waves of 40 KHz and 240 W for 10 minutes and washing in a fluorine-based solvent is 70% or more.

7. The optical laminate according to claim 1, wherein haze is more than 2%, and a contact angle difference with respect to water before and after an abrasion test where a waste cloth is reciprocated 4000 times is 7° or less.

8. The optical laminate according to claim 1, wherein an initial amount of fluorine measured using X-ray fluorescence analysis (XRF) is 0.03 or more.

9. The optical laminate according to claim 1, wherein the optical function layer includes any one selected from an antireflection layer and a selective reflection layer.

10. The optical laminate according to claim 1, wherein the optical function layer includes a low-refractive index layer.

11. The optical laminate according to claim 1, wherein the optical function layer is made of a laminate in which a low-refractive index layer and a high-refractive index layer are alternately laminated.

12. The optical laminate according to claim 10, wherein the antifouling layer is provided in contact with the low-refractive index layer.

13. The optical laminate according to claim 1, wherein the adhesion layer contains a metal or an oxide of a metal.

14. The optical laminate according to claim 1, wherein the adhesion layer and the optical function layer are formed by sputtering.

15. An article comprising:

an optical laminate comprising:

a plastic film;

an adhesion layer;

an optical function layer; and an antifouling layer laminated in order, wherein:

the antifouling layer is made of a vapor-deposited film obtained by vapor deposition of an antifouling material;

the antifouling material contains a fluorine-based organic compound;

the adhesion layer is made of an oxide of Si;

a film thickness of the antifouling layer is 2.5 nm or more;

a water vapor transmission rate is 1.5 g/($m^2$·1 day) or less;

a hue change ΔE value of reflected color in consideration of specular light (SCI) after contacting a sodium hydroxide aqueous solution having a liquid temperature of 55° C. and a concentration of 0.1 mol/L for four hours is less than 10; and a surface roughness Ra of the antifouling layer is 3 nm or more and 10 nm or less.

16. The optical laminate according to claim 1, wherein the antifouling material is made of the fluorine-based organic compound.

17. The optical laminate according to claim 1, wherein a film thickness of the antifouling layer is 2.5 nm or more and 10 nm or less.

18. The optical laminate according to claim 1, wherein the surface roughness Ra of the antifouling layer is 5 nm or more and 8 nm or less.

19. The optical laminate according to claim 1 further comprising:

a hardcoat layer which includes a binder resin and a filler.

* * * * *